US012785567B2

(12) United States Patent
Zhu et al.

(10) Patent No.: US 12,785,567 B2
(45) Date of Patent: Nov. 3, 2026

(54) APPARATUS AND METHOD FOR MULTI-PHASE POWER CONVERTER IN LIGHT LOAD OPERATING MODE

(71) Applicant: Xi An M3 Semiconductor Corporation, Xi'an (CN)

(72) Inventors: Yanli Zhu, Xi'an (CN); Bo Yang, Allen, TX (US); Amin Hu, Xi'an (CN); Xiaoyu Xi, Dallas, TX (US)

(73) Assignee: Xi An M3 Semiconductor Corporation, Xi'an (CN)

(*) Notice: Subject to any disclaimer, the term of this patent is extended or adjusted under 35 U.S.C. 154(b) by 113 days.

(21) Appl. No.: 18/916,679

(22) Filed: Oct. 15, 2024

(65) Prior Publication Data

US 2026/0100649 A1 Apr. 9, 2026

(30) Foreign Application Priority Data

Oct. 9, 2024 (CN) ........................ 202411396579.8

(51) Int. Cl.

| | |
|---|---|
| ***H02M 3/158*** | (2006.01) |
| ***H02M 3/157*** | (2006.01) |
| ***H03K 5/1536*** | (2006.01) |
| *H03K 4/06* | (2006.01) |
| *H03L 7/08* | (2006.01) |

(52) U.S. Cl.

CPC ......... *H02M 3/1584* (2013.01); *H02M 3/157* (2013.01); *H03K 5/1536* (2013.01); *H03K 4/06* (2013.01); *H03L 7/08* (2013.01)

(58) Field of Classification Search

CPC .. H02M 3/1584; H02M 3/157; H02M 3/1586; H02M 3/158; H02M 1/0009; H02M 1/0025; H03K 5/1536; H03K 4/06; H03L 7/08

See application file for complete search history.

(56) References Cited

U.S. PATENT DOCUMENTS

| | | | | |
|---|---|---|---|---|
| 7,230,406 B2 * | 6/2007 | Huang ................ | H02M 3/1584 | 323/284 |
| 2008/0284398 A1 * | 11/2008 | Qiu ....................... | H02M 3/156 | 323/283 |
| 2015/0277460 A1 * | 10/2015 | Liu ..................... | H02M 3/1584 | 323/280 |
| 2017/0179822 A1 * | 6/2017 | Kobayashi .......... | H02M 3/1584 | |
| 2019/0115835 A1 * | 4/2019 | Cohen .................. | H02M 3/156 | |

(Continued)

*Primary Examiner* — Monica Lewis
*Assistant Examiner* — Jye-June Lee
(74) *Attorney, Agent, or Firm* — AP3 Law Firm PLLC

(57) ABSTRACT

An apparatus includes a first signal generator configured to produce a first reset signal for determining an on-time duration of a high-side switch of a first phase of a multi-phase power converter, a first comparator configured to produce a first set signal for determining a turn-on time instant of the high-side switch of the first phase based on a comparison between a first current sense signal and a voltage control signal, a first zero-crossing detection circuit configured to detect a zero-crossing of an inductor current in the first phase, and a first phase offset voltage generator configured to produce a first offset voltage used to configure the first phase to exit a first continuous conduction mode in response to the zero-crossing of the inductor current in the first phase.

20 Claims, 13 Drawing Sheets

(56) References Cited

U.S. PATENT DOCUMENTS

| | | | | |
|---|---|---|---|---|
| 2019/0149047 | A1* | 5/2019 | Gurlahosur | H02M 3/1584 323/344 |
| 2023/0110617 | A1* | 4/2023 | Yang | H02M 3/1584 323/266 |
| 2023/0198405 | A1* | 6/2023 | Bawa | H02M 3/158 323/282 |
| 2023/0344345 | A1* | 10/2023 | Oner | H02M 3/158 |

* cited by examiner

APPARATUS AND METHOD FOR MULTI-PHASE POWER CONVERTER IN LIGHT LOAD OPERATING MODE

CROSS-REFERENCE TO RELATED APPLICATIONS

This patent application claims priority to Chinese Patent Application No. CN 2024113965798, filed on Oct. 9, 2024, and entitled "Apparatus and Method for Multi-Phase Power Converter in Light Load Operating Mode," which is hereby incorporated by reference herein as if reproduced in its entirety.

TECHNICAL FIELD

The present invention relates to a multi-phase power converter, and, in particular embodiments, to a multi-phase power converter in light load operating mode.

BACKGROUND

With the development of mobile computing, artificial intelligence (AI), and cloud computing, there is an increasing demand for power supplies that provide low voltage and high current. Multi-phase power supply architectures are widely adopted in these applications due to their fast transient response, low output ripple, and straightforward thermal and mechanical design. Control methods such as valley current control combined with an internal clock or constant on-time (COT) are commonly used for these multi-phase power supplies. These control methods offer a simple and cost-effective circuit structure.

FIG. 1 illustrates a multi-phase power converter 100 employing a COT and valley current control method. The multi-phase power converter 100 comprises N phases. Each phase is implemented as a buck converter (step-down converter). The N phases are connected in parallel between an input power source VIN and an output voltage VOUT.

As shown in FIG. 1, each buck converter phase comprises a control circuit, two switches, and an inductor. The first buck converter may be alternatively referred to as a first phase or a master phase of the multi-phase power converter 100. As shown in FIG. 1, the first phase of the multi-phase power converter 100 comprises a first high-side switch QH1, a first low-side switch QL1, a first control circuit, and a first inductor L1. The switches QH1 and QL1 are connected in series between VIN and ground. The common node of QH1 and QL1 is denoted as SW1. The first inductor L1 is connected between SW1 and VOUT.

The first control circuit comprises a first Phase-Locked Loop (PLL) Oscillator (OSC) with a ramp generator block 102, a first phase on-timer 104, a first latch 105, a first control logic block 106, drivers 108 and 110 for driving the switches QH1 and QL1, a first current sense amplifier 112, and a first comparator 114. Throughout the description, the first Phase-Locked Loop Oscillator with a ramp generator block 102 may be alternatively referred to as a first PLL+OSC ramp generator 102 or a first ramp generator 102. The first phase on-timer 104 may be alternatively referred to as a master phase on-timer 104 or a first on-timer 104.

The second phase of the multi-phase power converter 100 comprises a second high-side switch QH2, a second low-side switch QL2, a second control circuit, and a second inductor L2. The switches QH2 and QL2 are connected in series between VIN and ground. The common node of QH2 and QL2 is denoted as SW2. The second inductor L2 is connected between SW2 and VOUT.

The second control circuit comprises a second Phase-Locked Loop (PLL) Oscillator (OSC) with a ramp generator block 122, a second phase on-timer 124, a second latch 125, a second control logic block 126, drivers 128 and 130 for driving the switches QH2 and QL2, a second current sense amplifier 132, and a second comparator 134. Throughout the description, the second Phase-Locked Loop (PLL) Oscillator (OSC) with a ramp generator block 122 may be alternatively referred to as a second PLL+OSC ramp generator 122 or a second ramp generator 122. The second phase on-timer 124 may be alternatively referred to as a second on-timer 124.

Similarly, each subsequent phase of the multi-phase power converter 100 (e.g., the third phase, fourth phase, etc.) includes corresponding switches (QH3, QL3 for the third phase, QH4, QL4 for the fourth phase, and so on), control circuits, and inductors (L3, L4, etc.). These components are arranged in the same configuration as in the first and second phases, with each pair of switches connected in series between VIN and ground, and each inductor connected between its respective common node (SW3, SW4, etc.) and VOUT.

An output capacitor C1 is connected between VOUT and ground to stabilize the output voltage. A load, not shown in FIG. 1, is coupled between VOUT and ground. The inductors of the multi-phase power converter 100 are connected in parallel and further connected to the load.

The multi-phase power converter 100 also comprises an error amplifier 116 as part of a feedback circuit. As illustrated in FIG. 1, an inverting input of the error amplifier 116 is used to detect a scaled version of the output voltage (VOUT) at a common node of a voltage divider formed by resistors R1 and R2. The signal fed into the inverting input of the error amplifier 116 is denoted as FB. A capacitor C2 is connected between the common node of resistors R1 and R2, and the output voltage VOUT of the multi-phase power converter 100, providing additional filtering or stabilization for the feedback circuit. The non-inverting input of the error amplifier 116 is connected to a predetermined reference voltage (VREF). Additionally, a soft start signal is applied to the error amplifier 116 to gradually increase the output voltage during startup, preventing inrush currents and overshoot. The error amplifier 116 compares the FB signal to VREF, generating a control voltage (VC) that regulates the operation of the multi-phase power converter 100.

A compensation network is connected between the output of the error amplifier 116 and ground. The compensation network comprises resistor R3, capacitor C3, and capacitor C4. The resistor R3 and the capacitor C4 are connected in series and further connected in parallel with the capacitor C3.

Each buck converter phase connects to the corresponding frequency-setting resistor through the Freq input, enabling the operating frequency of that phase to align with the external clock input signal's frequency. The first ramp generator 102 receives a clock input (CLK) and produces a master clock signal (CLKO) to coordinate the timing and phase shifts across all slave phases in the multi-phase power converter 100. The CLK signal is a high-frequency clock signal that provides reference timing to ensure that the multi-phase power converter 100 operates at a defined frequency. The ramp generator in each slave phase receives the CLKO signal as its clock, ensuring synchronized operation. The PHN signal (PH1, PH2, etc.) is an input to the ramp generator in each phase. It is used to select the appropriate phase shift for the clock in each phase of the multi-phase power converter 100.

As illustrated in FIG. 1, the ramp generator in each phase is designed to produce a ramp signal, which is then fed into the on-timer for precise timing control within each phase. The on-timer use the ramp signal, in conjunction with other inputs, to determine the exact switching intervals of the high-side and low-side switches, ensuring efficient power conversion. All subsequent phases operate in the same manner as the first phase, with each phase having its own dedicated ramp generator, on-timer, latch, and control logic to maintain synchronized and optimized operation across the entire multi-phase power converter 100.

Taking the first phase as an example, the current flowing through the first inductor L1 is detected by a first current sensing apparatus, generating a first sensed current signal denoted as Isns1. This sensed current signal Isns1 is then converted to a voltage and amplified by the first current sense amplifier 112, with the amplified output denoted as Vcs1. The current sense voltage Vcs1 is then fed into the inverting input of the first comparator 114. The non-inverting input of the first comparator 114 is connected to the output of the error amplifier 116, which provides the control voltage (VC). When Vcs1 at the inverting input falls below VC at the non-inverting input, the first comparator 114 generates a pulse signal (PUMP1).

The PUMP1 from the first comparator 114 is fed into a first on-time generator, which comprises the first on-timer 104 and the first latch 105. The first on-time generator generates a first PWM signal (TON1), which determines the duration in which the first high-side switch QH1 remains on. TON1 is then fed into the first control logic block 106, which converts this signal into gate drive signals (Hson1 and Lson1). The first control logic block 106 sends the Hson1 signal to the driver circuit 108, which amplifies it to a level suitable for driving the first high-side switch QH1. When Hson1 is high, QH1 is turned on, and the voltage on the first switching node SW1 is equal to the input voltage VIN. By controlling the on-time of QH1, the first on-time generator ensures that the first inductor L1 current ramps up appropriately, delivering the correct amount of energy to the load. Once the on-time duration, determined by the output of the first on-time generator, is completed, the first control logic block 106 deactivates Hson1, turning off QH1. Simultaneously, the first control logic block 106 activates the Lson1 signal, which is sent to the driver circuit 110. The driver circuit 110 then turns on the first low-side switch (QL1), allowing the first inductor L1 current to ramp down and prepare for the next cycle. This process is repeated cyclically, ensuring efficient and stable voltage regulation throughout the operation of the multi-phase power converter 100.

FIG. 2 illustrates timing diagrams of various signals associated with the multi-phase power converter 100 shown in FIG. 1. The horizontal axis of FIG. 2 represents intervals of time. The timing diagram has three rows. The first row represents the current sense voltage Vcs1 for the first phase. Vcs1 includes a series of periodic, triangular waveforms. The first row also includes the control voltage VC. The control voltage VC is depicted as a steady, horizontal line. The control voltage VC serves as a reference against which Vcs1 is compared. The second row represents the voltage on the output TON1 of the first on-time generator. TON1 includes a series of rectangular pulses, transitioning between logic-high and logic-low states. The third row represents the output PUMP1 of the first comparator 114 for the first phase.

As shown in FIG. 2, at t1, the current sense voltage Vcs1 drops below the control voltage VC. This condition triggers the first comparator 114 to generate the pulse signal PUMP1. In response to this pulse, TON1 changes from a logic-low state to a logic-high state. TON1 is subsequently fed into the first control logic block 116 in which the logic-high state of TON1 is converted into a gate drive signal to turn on the first high-side switch QH1. Once QH1 is turned on, the voltage on the switching node SW1 is equal to the input voltage VIN.

From time t1 to t2, QH1 remains on, causing the current flowing through the first inductor L1 to ramp up in a linear manner. As a result, Vcs1 also ramps up accordingly, as shown in FIG. 2. As the current sense voltage Vcs1 exceeds the control voltage VC, the pulse signal PUMP1 changes from high to low. At time t2, the on-time duration ends as determined by the first on-time generator. Consequently, TON1 changes from a logic-high state to a logic-low state. In response to this logic-low state, QH1 is turned off and the low-side switch QL1 is turned on. Once QL1 is turned on, the voltage on the common node SW1 is equal to the ground potential. From time t2 to t3, QL1 remains on, and the current flowing through the first inductor L1 ramps down in a linear manner. As a result, Vcs1 also ramps down accordingly, as shown in FIG. 2. At time t3, the current sense voltage Vcs1 drops below the control voltage VC, causing the pulse signal PUMP1 to change from low to high again. This process then repeats cyclically.

Traditional multi-phase power converters typically operate in Fixed Frequency Pulse Width Modulation (FPWM) mode. In this mode, when the load decreases, all power paths continue to operate simultaneously, and the switching frequency remains constant. This can cause the inductor current to cross zero, resulting in significant inefficiencies, particularly under light load conditions. With the increasing emphasis on green energy initiatives by various countries and the growing user demand for longer battery life in mobile devices, enhancing light load efficiency has become an essential objective in the design of modern power supply systems, necessitating more advanced solutions that can adapt to varying load conditions without compromising performance.

The present invention proposes a new apparatus and method for light-load control in multi-phase power converters. This approach enables a smooth reduction in the number of active phases as the load decreases, thereby reducing the number of switching cycles. As a result, it improves light-load efficiency while maintaining stable output voltage and low ripple.

SUMMARY

Technical advantages are generally achieved, by embodiments of this disclosure which describe a multi-phase power converter in light load operating mode.

In accordance with an embodiment, an apparatus comprises a first signal generator configured to produce a first reset signal for determining an on-time duration of a high-side switch of a first phase of a multi-phase power converter, a first comparator configured to produce a first set signal for determining a turn-on time instant of the high-side switch of the first phase based on a comparison between a first current sense signal and a voltage control signal, a first zero-crossing detection circuit configured to detect a zero-crossing of an inductor current in the first phase, and a first phase offset voltage generator configured to produce a first offset voltage used to configure the first phase to exit a first continuous conduction mode in response to the zero-crossing of the inductor current in the first phase.

In accordance with another embodiment, a method comprises generating a first reset signal for determining a turn-off time instant of a high-side switch of a first phase of a multi-phase power converter, generating, by a first comparator, a first set signal for determining a turn-on time instant of the high-side switch of the first phase based on a comparison between a first current sense signal and a voltage control signal, detecting, by a first zero-crossing detection circuit, a zero-crossing of an inductor current in a first output inductor of the first phase, and generating, by a first phase offset voltage generator, a first offset voltage being used to configure the first phase to exit a first continuous conduction mode in response to the zero-crossing of the inductor current in the first phase.

In accordance with yet another embodiment, a power converter comprises a first step-down converter comprising a first high-side switch, a first low-side switch, and a first inductor, a second step-down converter comprising a second high-side switch, a second low-side switch, and a second inductor, and a control apparatus comprising: a first on-timer configured to produce a first reset signal for determining an on-time duration of the first high-side switch, a first comparator configured to produce a first set signal for determining a turn-on time instant of the first high-side switch based on a comparison between a first current sense signal and a voltage control signal, a first zero-crossing detection circuit configured to detect a zero-crossing of the current through the first inductor, a first phase offset voltage generator configured to produce a first offset voltage used to configure the first step-down converter to exit a first continuous conduction mode in response to the zero-crossing of the current through the first inductor, a second on-timer configured to produce a second reset signal for determining the on-time duration of the second high-side switch, a second comparator configured to produce a second set signal for determining a turn-on time instant of the second high-side switch based on a comparison between a second current sense signal and a voltage control signal, a second zero-crossing detection circuit configured to detect a zero-crossing of the current through the second inductor, and a second phase offset voltage generator configured to produce a second offset voltage used to configure the second step-down converter to exit continuous conduction mode in response to the zero-crossing of the current through the second inductor, wherein the first offset voltage is greater than the second offset voltage, the second phase exiting the second continuous conduction mode before the first phase exits the first continuous conduction mode.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Further, one or more features from one or more of the following described embodiments may be combined to create alternative embodiments not explicitly described, and features suitable for such combinations are understood to be within the scope of this disclosure. It is therefore intended that the appended claims encompass any such modifications or embodiments.

The present disclosure will be described with respect to preferred embodiments in a specific context, namely a multi-phase power converter in light load operating mode. The invention may also be applied, however, to a variety of power converters. Hereinafter, various embodiments will be explained in detail with reference to the accompanying drawings.

Figure 1:
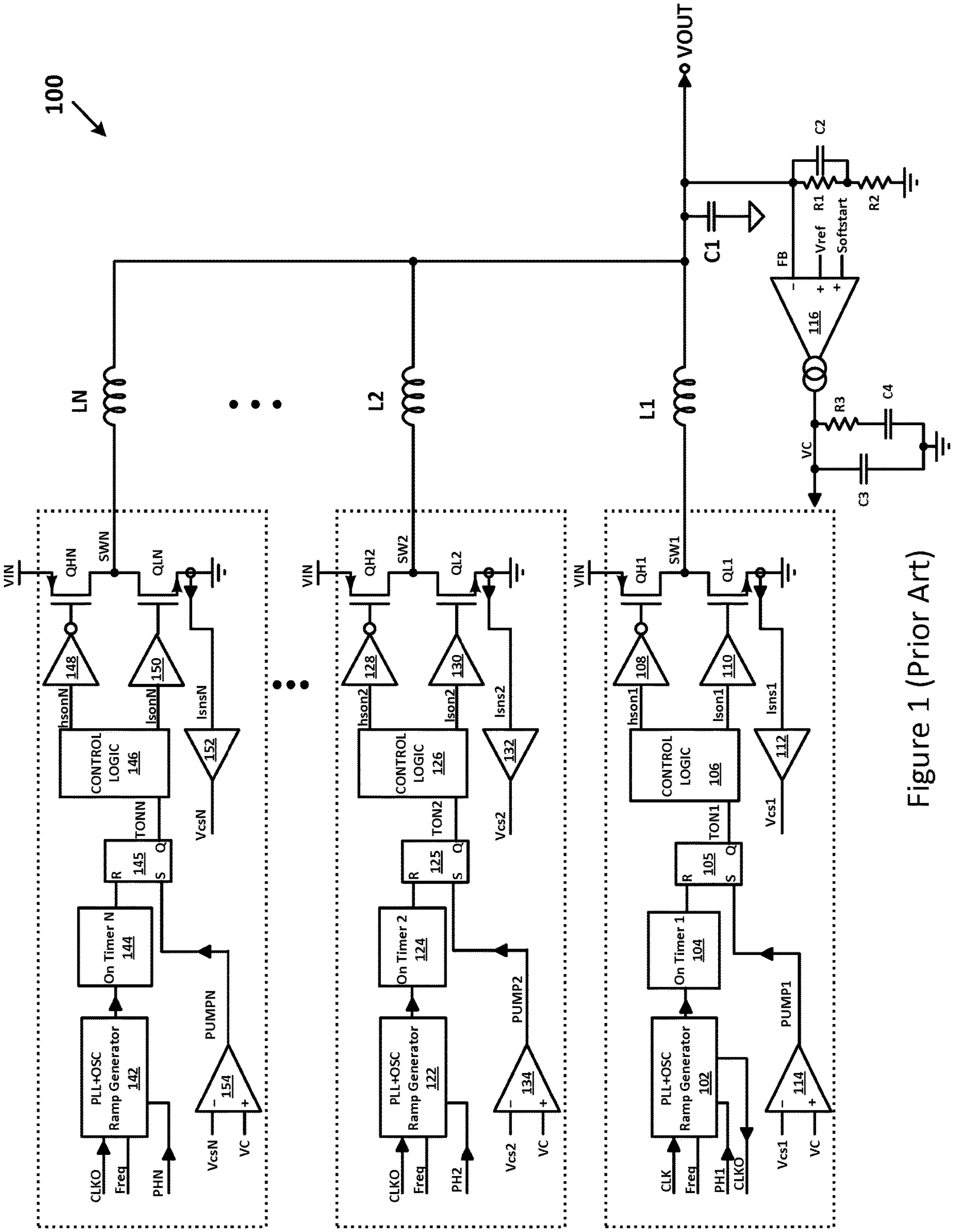
Figure 1 (Prior Art)
FIG. 1 illustrates a multi-phase power converter employing a constant on-time and valley current control method.
Figure 2:
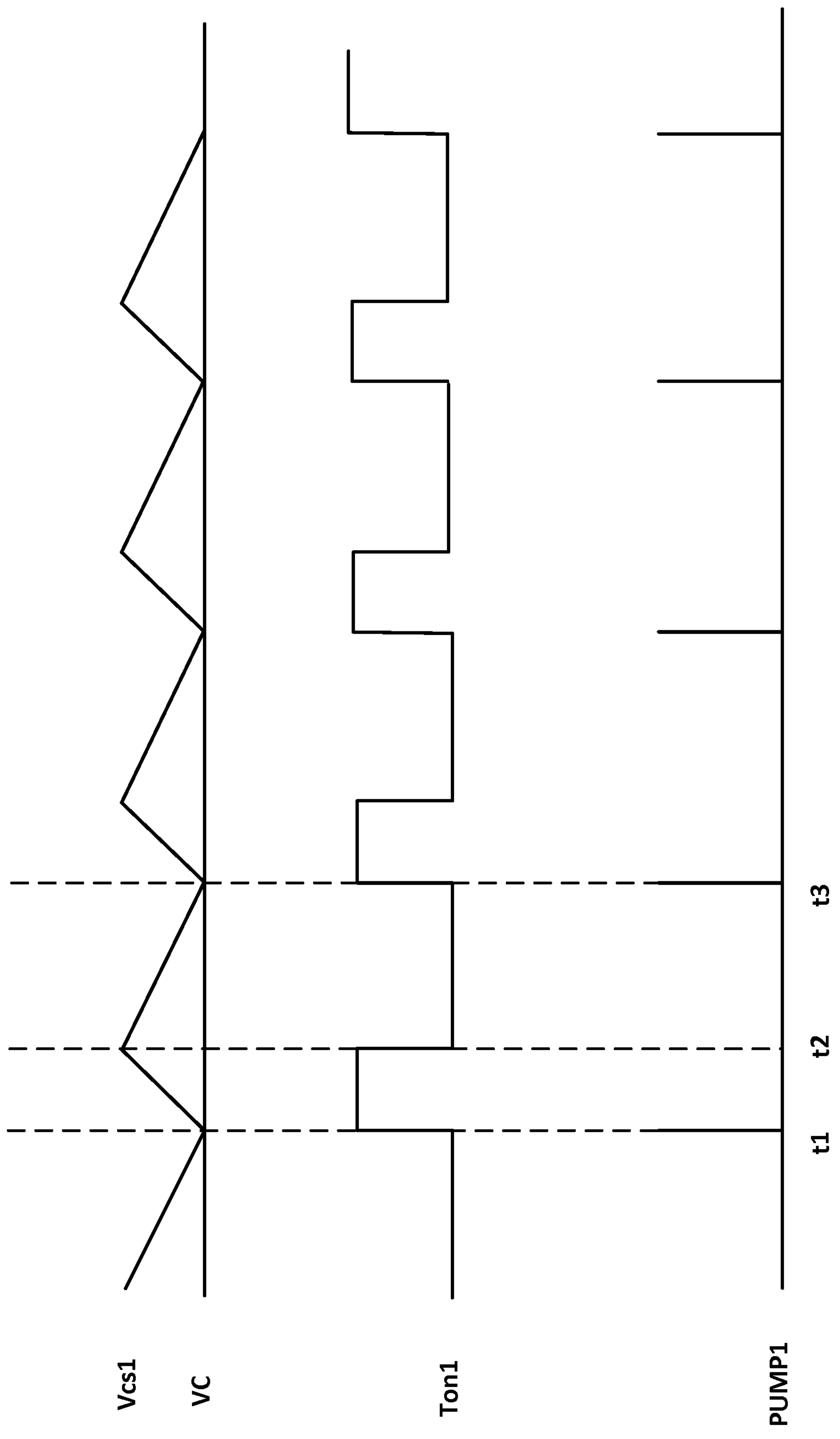
Figure 2 (Prior Art)
FIG. 2 illustrates timing diagrams of various signals associated with the multi-phase power converter shown in FIG. 1.
Figure 3:
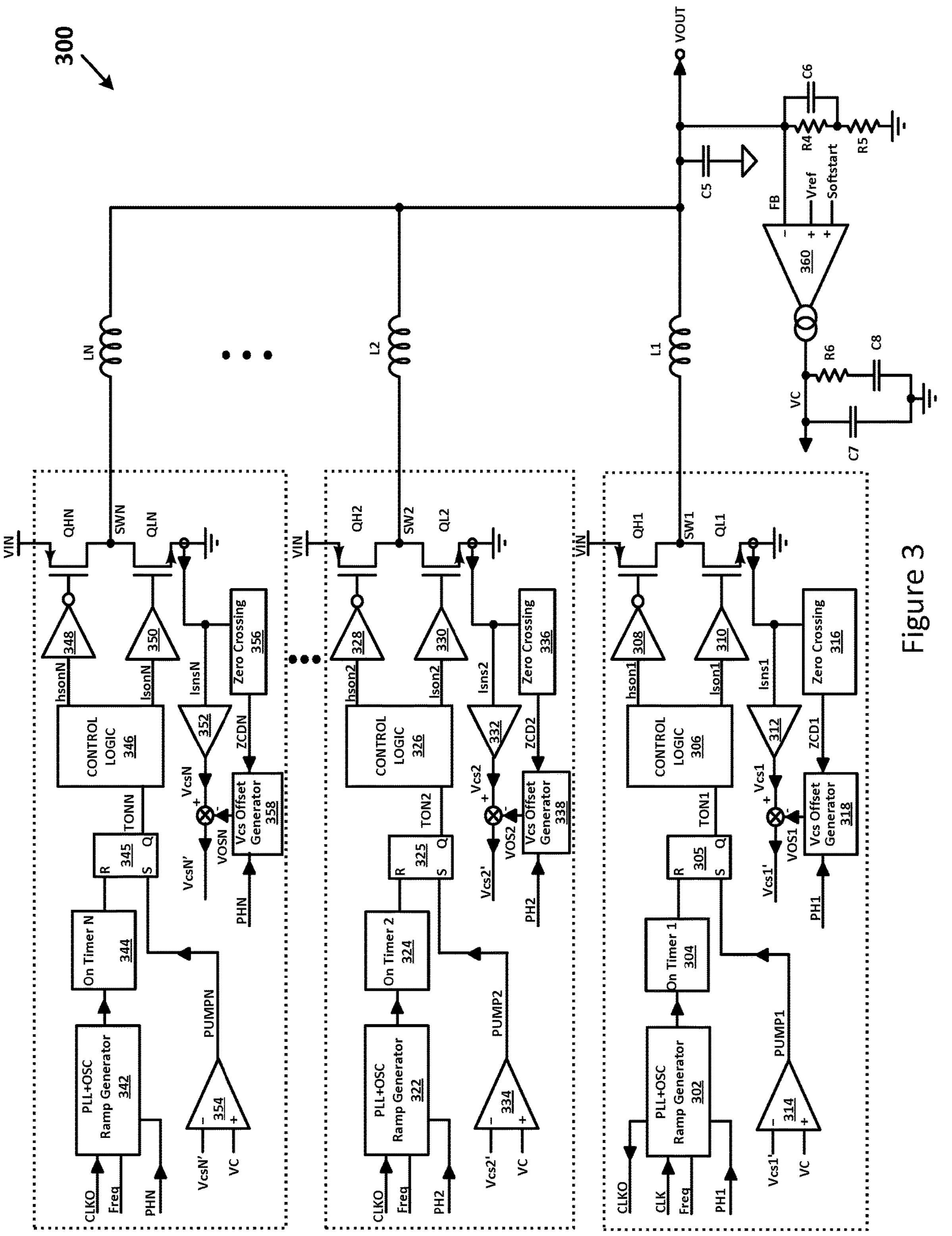
FIG. 3 illustrates a schematic diagram of a multi-phase power converter in accordance with various embodiments of the present disclosure.

FIG. 3 illustrates a schematic diagram of a multi-phase power converter in accordance with various embodiments of the present disclosure. The multi-phase power converter 300 in FIG. 3 comprises N phases. Each phase is implemented as a buck converter (step-down converter). The N phases are connected in parallel between an input power source VIN and an output VOUT. It should be noted that the number of buck converters illustrated in FIG. 3 is limited solely for the purpose of clarity in illustrating the inventive aspects of the various embodiments. The present disclosure is not restricted to any specific number of buck converters and can include two or more.

As shown in FIG. 3, each buck converter phase comprises a control circuit, switches, and an inductor. For example, the first buck converter comprises a first high-side switch QH1, a first low-side switch QL1, and a first inductor L1. The switches QH1 and QL1 are connected in series between an input voltage VIN and ground. The first inductor L1 is connected between a common node of QH1 and QL1 (referred to as SW1), and an output voltage VOUT. The first phase may function as a master phase of the multi-phase power converter 300. Throughout the description, the first buck converter may be alternatively referred to as a first phase or a master phase of the multi-phase power converter 300.

The second buck converter of the multi-phase power converter 300 comprises a second high-side switch QH2, a second low-side switch QL2, and a second inductor L2. The switches QH2 and QL2 are connected in series between VIN and ground. The second inductor L2 is connected between a common node of QH2 and QL2 (referred to as SW2), and VOUT. The second phase may function as a slave phase of the multi-phase power converter 300. Throughout the description, the second buck converter may be alternatively referred to as a second phase of the multi-phase power converter 300.

It should be noted that the description applies similarly to additional phases beyond the second phase, as indicated by the variable N, which is greater than 2. Each additional phase, such as the Nth phase, comprises corresponding switches QHN and QLN, and an inductor LN, all connected in the same manner as the first and second phases. Each inductor LN is connected between the common node of QHN and QLN (referred to as SWN) and the output VOUT. All other phases, beyond the first phase, can function as slave phases and may alternatively be referred to as a slave phase of the multi-phase power converter 300.

The switches (e.g., QH1) shown in FIG. 3 may be implemented as n-type metal oxide semiconductor (NMOS) transistors. Alternatively, the switches may be implemented as other suitable controllable devices such as metal oxide semiconductor field effect transistor (MOSFET) devices, bipolar junction transistor (BJT) devices, super junction transistor (SJT) devices, insulated gate bipolar transistor (IGBT) devices, gallium nitride (GaN) based power devices and/or the like.

As shown in FIG. 3, an output capacitor C5 is connected between VOUT and ground to stabilize the output voltage. A load, not shown in FIG. 3, is coupled between VOUT and ground. The inductors of the N phases are connected in parallel, and further connected to the load.

As shown in FIG. 3, each phase further comprises a control circuit. The control circuit for the first phase of the multi-phase power converter 300 comprises a first Phase-Locked Loop Oscillator with a ramp generator block 302, a first phase PLL on-timer 304, a first latch 305, a first control logic block 306, driver circuits 308 and 310 for driving the switches QH1 and QL1, a first current sense amplifier 312, and a first comparator 314, a first zero-crossing detector (ZCD) 316, and a first offset voltage generator 318. Throughout the description, the first Phase-Locked Loop Oscillator with a ramp generator block 302 may be alternatively referred to as a first PLL+OSC ramp generator 302 or a first ramp generator 302. The first phase PLL on-timer 304 may be alternatively referred to as a master phase on-timer 304 or a first phase on-timer 304. The first offset voltage generator 318 may be alternatively referred to as a first Vcs offset generator 318.

The control circuit for the second phase of multi-phase power converter 300 comprises a second Phase-Locked Loop Oscillator with a ramp generator block 322, a second phase PLL on-timer 324, a second latch 325, a second control logic block 326, drivers 328 and 330 for driving the switches QH2 and QL2, a second current sense amplifier 332, and a second comparator 334, a second zero-crossing detector (ZCD) 336, and a second offset voltage generator 338.

Throughout the description, the second Phase-Locked Loop Oscillator with a ramp generator block 322 may be alternatively referred to as a second PLL+OSC ramp generator 322 or a second ramp generator 322. The second phase PLL on-timer 324 may be alternatively referred to as a second phase on-timer 324. The second offset voltage generator 338 may be alternatively referred to as a second Vcs offset generator 338.

Similarly, the control circuit of the Nth phase of the multi-phase power converter 300 comprises an Nth Phase-Locked Loop oscillator with a ramp generator block 342, an Nth phase PLL on-timer 344, an Nth latch 345, an Nth control logic block 346, drivers 348 and 350 for driving the switches QHN and QLN, an Nth current amplifier 352, an Nth comparator 354, an Nth zero-crossing detector (ZCDN) 356, and an Nth offset voltage generator 358. An Nth on-time generator comprises the Nth phase on-timer 344 and the Nth latch 345. Throughout the description, the Nth Phase-Locked Loop Oscillator with a ramp generator block 342 may be alternatively referred to as an Nth PLL+OSC ramp generator 342 or an Nth ramp generator 342. The Nth phase PLL on-timer 344 may be alternatively referred to as an Nth phase on-timer 344. The Nth offset voltage generator 358 may be alternatively referred to as an Nth Vcs offset generator 358.

The multi-phase power converter 300 further comprises an error amplifier 360 as part of a feedback circuit. As illustrated in FIG. 3, an inverting input of the error amplifier 360 is used to detect a scaled version of the output voltage VOUT at the common node of a voltage divider formed by resistors R4 and R5. The signal fed into the inverting input of the error amplifier 360 is denoted as FB. The non-inverting input of the error amplifier 360 is connected to a predetermined reference voltage VREF. A capacitor C6 is connected between the common node of resistors R4 and R5 and VOUT. Additionally, a soft start signal is applied to the error amplifier 360 to gradually increase the output voltage during startup, preventing inrush currents and overshoot. The error amplifier 360 compares the FB signal to VREF, generating a control voltage VC that regulates the output voltage of the multi-phase power converter 300.

A compensation network is connected between the output of the error amplifier 360 and ground. The compensation network comprises resistor R6, capacitor C7, and capacitor C8. The resistor R6 and the capacitor C8 are connected in series and further connected in parallel with the capacitor C7.

Each buck converter phase connects to the corresponding frequency-setting resistor through the Freq input, enabling the operating frequency of that phase to align with the external clock input signal's frequency. The first ramp generator 302 receives a clock input (CLK) and produces a master clock signal (CLKO) to coordinate the timing and phase shifts across all slave phases in the multi-phase power converter 300. The CLK signal is a high-frequency clock signal that provides reference timing to ensure that the multi-phase power converter 300 operates at a defined frequency. The ramp generator in each slave phase receives the CLKO signal as its clock, ensuring synchronized operation. The PHN signal (PH1, PH2, etc.) is an input to the ramp generator in each phase. It is used to select the appropriate phase shift for the clock in each phase of the multi-phase power converter 300.

As illustrated in FIG. 3, the current flowing through the first inductor L1 is detected by a first current sensing apparatus, generating a first sensed current signal denoted as Isns1. This sensed current signal Isns1 is then converted to a voltage and amplified by the first current sense amplifier 312, which provides a suitable current sensing gain, with the amplified output denoted as Vcs1.

The first zero-crossing detector 316 is designed to receive the first sensed current signal Isns1. As the load decreases, the current demand from the load is reduced, requiring less energy from the power converter to maintain the desired output voltage. Consequently, the inductor current in each phase, including the first phase, decreases proportionally until it approaches zero. Upon detecting this zero-crossing point in the first sensed current signal Isns1, the first zero-crossing detector 316 generates a first zero-crossing detection signal ZCD1. When the current crosses zero, the first zero-crossing detection signal ZCD1 changes from a logic-low state to a logic-high state.

The first zero-crossing detection signal ZCD1 is then fed into the first Vcs offset voltage generator 318. The first Vcs offset voltage generator 318 receives a phase signal PH1 and the first zero-crossing detection signal ZCD1. The phase signal PH1 ensures that the first Vcs offset voltage generator 318 operates in sync with the timing of the first phase. When the first zero-crossing detection signal ZCD1 changes from a logic-low state to a logic-high state, the first Vcs offset voltage generator 318 outputs a first offset voltage VOS1. VOS1 is injected into the output (Vcs1) of the first current sense amplifier 312 to produce a first adjusted current sense voltage Vcs1'. In some embodiments, the VOS1 is subtracted from the first current sense voltage Vcs1 at the output of the first current sense amplifier 312 to generate the first adjusted current sense voltage Vcs1'.

As illustrated in FIG. 3, the non-inverting input of the first comparator 314 is connected to the output of the error amplifier 360, which provides the control voltage VC. The inverting input of the first comparator 314 is connected to the first adjusted current sense voltage Vcs1'. The first comparator 314 compares the first adjusted current sense voltage Vcs1' to the control voltage VC. When Vcs1' at the inverting input falls below VC at the non-inverting input, the first comparator 314 generates a first pulse signal PUMP1. At this moment, PUMP1 switches from low to high. When PUMP1 goes high, the first Vcs offset voltage VOS1 added to the first current sense voltage Vcs1 at the output of the first current sense amplifier 312 is simultaneously removed.

The output of the first phase on-timer 304 is connected to the reset input of the first latch 305. When the PUMP1 signal is high, the first latch 305 is set, and output a first PWM signal TON1, determining the duration in which QH1 remains on. TON1 is then fed into the first control logic block 306, which converts this signal into gate drive signals (Hson1 and Lson1). The first control logic block 306 sends the Hson1 signal to the driver circuit 308, which amplifies it to a level suitable for driving QH1. When Hson1 is high, QH1 is turned on, and the voltage on SW1 is equal to VIN. Simultaneously, the Lson1 signal is driven low, ensuring that the low-side switch QL1 is turned off during this period. By controlling the on-time of QH1, the first on-time generator ensures that the first inductor L1 current ramps up appropriately, delivering the correct amount of energy to the load.

Once the on-time duration is completed, as determined by the first phase on-timer 304, a reset signal is generated to reset the first latch 305. This causes the first control logic block 306 to deactivate Hson1, turning off QH1. Simultaneously, the first control logic block 306 activates the Lson1 signal, which is sent to the driver circuit 310. The driver circuit 310 then turns on QL1, allowing the first inductor L1 current to ramp down and prepare for the next cycle.

As illustrated in FIG. 3, each phase in the multi-phase power converter 300 operates in a similar manner to the first phase described above. Each phase generates a corresponding sensed current signal (Isns1, Isns2, etc.). The current flowing through the inductor (L1, L2, etc.) in each phase is similarly detected and amplified by a current sense amplifier and converted into a proportional current sense voltage signal (Vcs1, Vcs2, etc.). The zero-crossing point of the inductor current in each phase is detected by a zero-crossing detector when the current through the inductor crosses zero. Upon detecting the zero-crossing point of the current waveform, the zero-crossing detector block in each phase outputs a zero-crossing detection signal (ZCD1, ZCD2, etc.). This zero-crossing detection signal is then fed into the Vcs Offset Generator for that phase. The Vcs offset generator uses this signal to produce an offset voltage (VOS1, VOS2, etc.) that is injected to a corresponding current sense voltage signal (Vcs1, Vcs2, etc.), resulting in an adjusted current sense voltage (Vcs1', Vcs2', etc.). The adjusted current sense voltage (Vcs1', Vcs2', etc.) is applied to the inverting input of the comparator in the corresponding phase. Each comparator compares its respective adjusted current sense voltage with the control voltage VC. When the adjusted current sense voltage falls below VC, the PUMP signal of the phase goes high, turning on the upper switch (QH1, QH2, etc.). In each phase, the on-timer and latch work together to form an on-time generator, which is configured to generate a PWM signal (TON1 for the first phase, TON2 for the second phase, and so on). The PWM signal is then sent to the control logic block in corresponding phase, which manages the switching of the phase. After the fixed TON time determined by the on-time generator in each phase, the upper switch turns off and the lower switch turns on.

Figure 4:
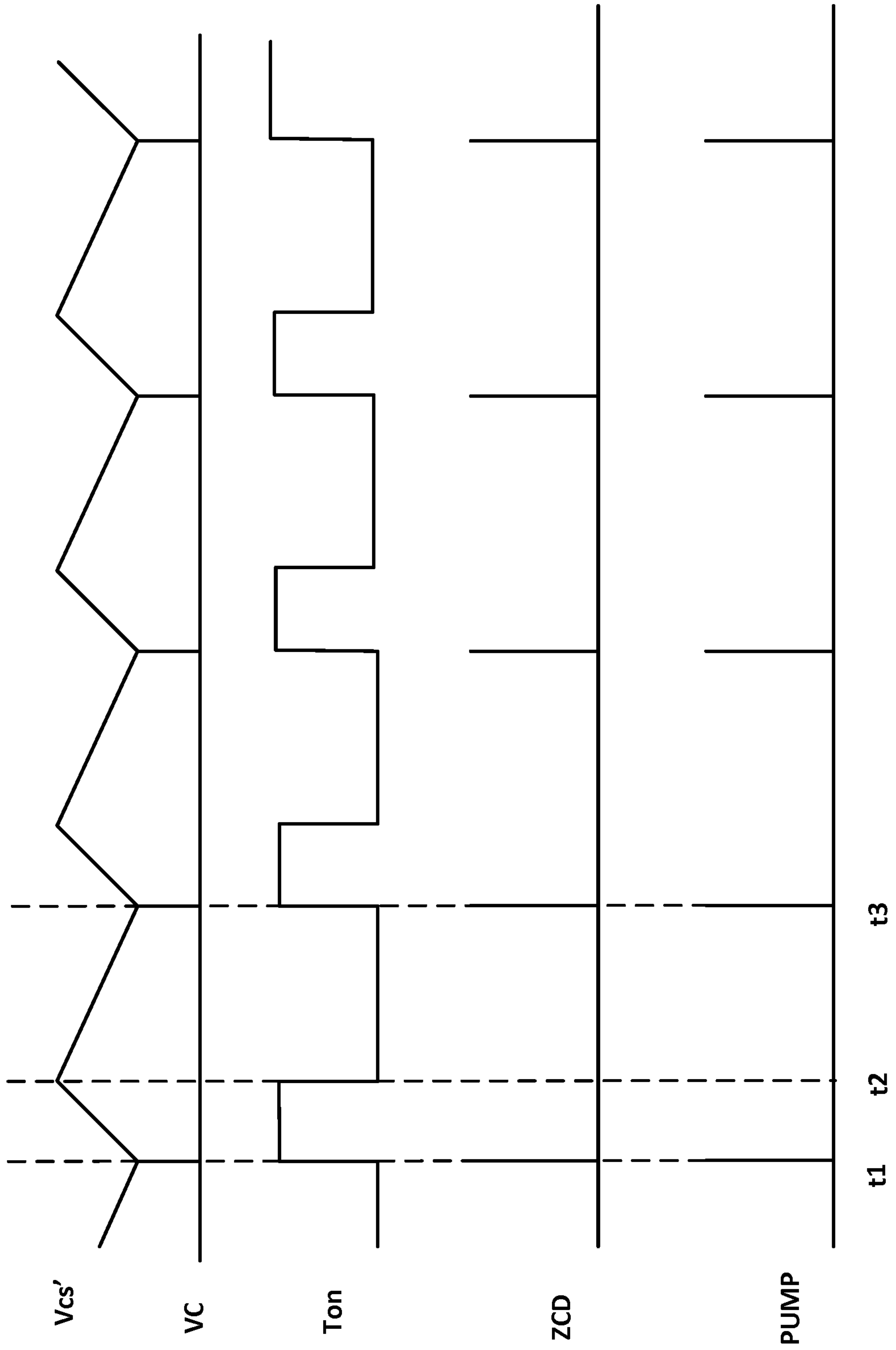
FIG. 4 illustrates a timing diagram of various signals associated with the multi-phase power converter shown in FIG. 3, in accordance with various embodiments of the present disclosure.

FIG. 4 illustrates a timing diagram of various signals associated with the multi-phase power converter 300 shown in FIG. 3, in accordance with various embodiments of the present disclosure. The horizontal axis of FIG. 4 represents intervals of time, with key time points labeled as t1, t2, and t3. There are four rows. The first row represents the adjusted current sense voltage Vcs' in one phase and the control voltage VC. The second row represents the voltage (TON) on the output of the on-time generator in the phase. The third row represents the zero-crossing detection signal (ZCD) in the phase. The fourth row represents the output (PUMP) of the comparator in the phase.

As the load decreases, the inductor current in the phase also decreases correspondingly until it crosses zero. At time t1, when the zero-crossing detector block in the phase detects the zero-crossing of the inductor current (Isns), the ZCD signal goes high. In response to the high ZCD signal, the Vcs offset generator injects an offset voltage (VOS) into the current sense voltage (Vcs) in that phase, resulting in the adjusted current sense voltage Vcs' signal. The comparator in this phase then compares Vcs' with VC. As shown in FIG. 4, at time t1, if Vcs' is lower than the VC, the PUMP signal in this phase immediately goes high, maintaining the phase in Continuous Conduction Mode (CCM). The on-timer generator in the phase receives the PUMP signal and changes TON from a logic-low state to a logic-high state. In response to the logic-high state of TON, the high-side gate drive signal Hson changes from a logic-low state to a logic-high state, and the low-side gate drive signal Lson changes from a logic-high state to a logic-low state. Consequently, QH is turned on, and QL is turned off. Once QH is turned on, the voltage on the switching node SW is equal to VIN. As the inductor current increases and moves away from the zero-crossing point, the ZCD signal transitions back to a logic-low state. This transition removes the Vcs offset voltage, restoring Vcs' to its original level. Since the restored Vcs is higher than VC, the PUMP signal in this phase transitions back to a logic-low state shortly after t1.

From t1 to t2, QH remains on, causing the current flowing through the inductor to ramp up in a linear manner, as indicated by the increasing slope of the Vcs' waveform.

At t2, the on-time duration ends as determined by the on-time generator in that phase. TON changes from a logic-high state to a logic-low state. In response to this logic-low state, the high-side gate drive signal Hson changes from a logic-high state to a logic-low state, and the low-side gate drive signal Lson changes from a logic-low state to a logic-high state. Consequently, QH is turned off, and QL is turned on. Once QL is turned on, the voltage on the switching node SW is equal to the ground potential.

From t2 to t3, QL remains on, causing the current flowing through the inductor to ramp down in a linear manner, as indicated by the decreasing slope of the Vcs' waveform.

At time t3, when the inductor current crosses zero again, the ZCD signal transitions to a logic-high state. This causes the PUMP signal to go high again, enabling QH, and turning off QL, thus repeating the cycle.

Figure 5:
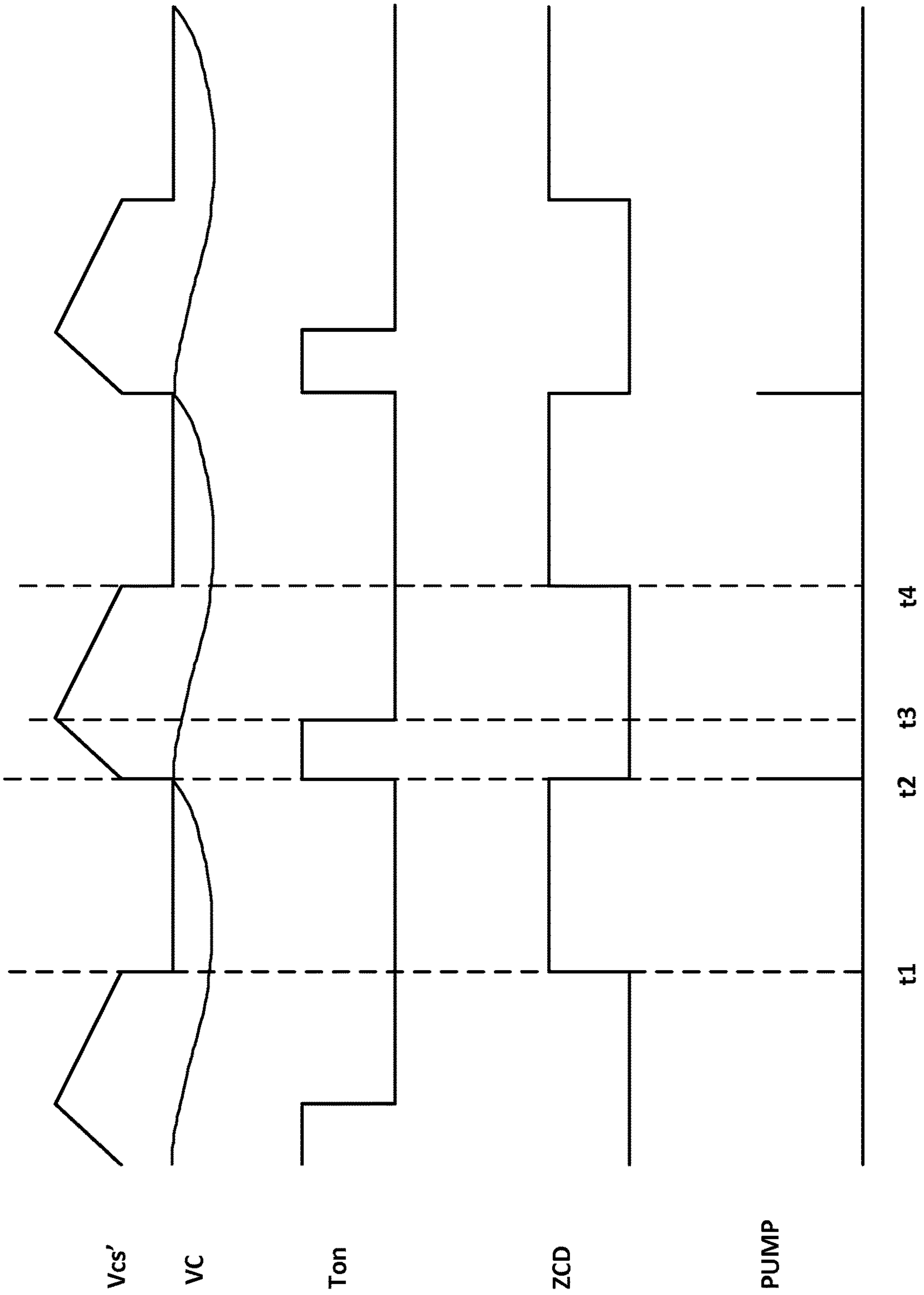
FIG. 5 illustrates a timing diagram of various signals associated with the multi-phase power converter from FIG. 3 in accordance with various embodiments of the present disclosure.

FIG. 5 illustrates a timing diagram of various signals associated with the multi-phase power converter from FIG. 3 in accordance with various embodiments of the present disclosure. The horizontal axis of FIG. 5 represents intervals of time. There are four rows. The first row represents the adjusted current sense voltage (Vcs') in one phase and the control voltage (VC). The second row represents the voltage on the output of the on-time generator (TON) in the phase. The third row represents the zero-crossing detection signal (ZCD) in the phase. The fourth row represents the PUMP signal in the phase.

As shown in FIG. 5, at time t1, when the zero-crossing detector block detects the zero-crossing of the inductor current (Isns), the ZCD signal goes high. In response to the high ZCD signal, the Vcs offset generator injects an offset voltage VOS into the current sense voltage VCS in that phase, resulting in the adjusted current sense voltage signal Vcs'. The comparator in this phase compares Vcs' with VC. As shown in FIG. 5, at time t1, if Vcs' is still higher than VC, the PUMP signal in this phase stays low, preventing the upper switch QH from turning on. Since the lower switch QL also remains off after the inductor current reaches zero to prevent reverse conduction, the system operates in Discontinuous Conduction Mode (DCM).

From t1 to t2, VOUT continues to drop due to the load. As VOUT decreases, the difference between the feedback signal FB and VREF increases. In response to this increased error signal, the error amplifier raises VC to correct the drop in VOUT. From t1 to t2, the ZCD signal remains high, indicating the inductor current in this phase remains zero. Vcs' remains constant during t1 to t2 since the inductor current does not increase.

As shown in FIG. 5, at t2, when VC rises above Vcs', the comparator is triggered to send a PUMP signal having a logic-high state. The on-timer generator in the phase receives the PUMP signal and change TON from a logic-low state to a logic-high state. In response to the logic-high state of TON, the high-side gate drive signal Hson changes from a logic-low state to a logic-high state. Consequently, QH is turned on and QL is turned off. Once QH is turned on, the voltage on the switching node SW is equal to VIN. As the inductor current begins to increase, the zero-crossing detector detects this and transitions from high to low, indicating that the current is no longer at the zero-crossing point. When the ZCD signal goes low, the VOS offset is removed, restoring Vcs' to its original value. Since the restored Vcs' is higher than VC, the PUMP signal in this phase transitions back to a low state shortly after it had gone high.

From t2 to t3, QH remains on, and the inductor current ramps up in a linear manner, as shown by the increasing slope of the Vcs' waveform.

At t3, the on-time duration ends as determined by the on-time generator in that phase. TON changes from a logic-high state to a logic-low state. In response to this logic-low state, The high-side gate drive signal Hson changes from a logic-high state to a logic-low state, and the low-side gate drive signal Lson changes from a logic-low state to a logic-high state. Consequently, QH is turned off, and QL is turned on. Once QL is turned on, the voltage on the switching node SW is equal to the ground potential.

From t3 to t4, QL remains on, causing the current flowing through the inductor to ramp down in a linear manner, as indicated by the decreasing slope of the Vcs' waveform.

At t4, the zero-crossing detector block detects the zero-crossing of the inductor current (Isns) again, thus repeating the cycle.

If the rise in VC does not exceed Vcs', the comparator does not trigger a high PUMP signal. As a result, the PUMP signal remains low, preventing the on-timer generator from initiating a new switching cycle, and QH remains off. Consequently, this phase completely exits active operation, effectively shutting down until the load demand increases or VOUT drops, causing VC to rise above Vcs' and prompting the phase to re-enter active operation.

In a multi-phase power converter, although the error amplifier output VC is shared across all phases, each phase may have a specific VC threshold at which it enters DCM due to the varying VOS offsets applied to the current sense voltage (Vcs) in each phase. These different VC thresholds correspond to different load currents, allowing each phase to enter DCM or exit active operation at different load levels.

As the load decreases, each phase may enter DCM at a different point depending on its specific VOS offset. The phase with the smallest negative VOS offset added to Vcs will reach the threshold for DCM first and exit active operation sooner, as Vcs' in that phase is higher, making it easier for VC to drop below it. Conversely, the phase with the largest negative VOS offset, typically the master phase, is added to Vcs and will be the last to enter DCM, continuing to operate in light load mode, as it needs a more significant reduction in VC to reach the same condition.

Figure 6:
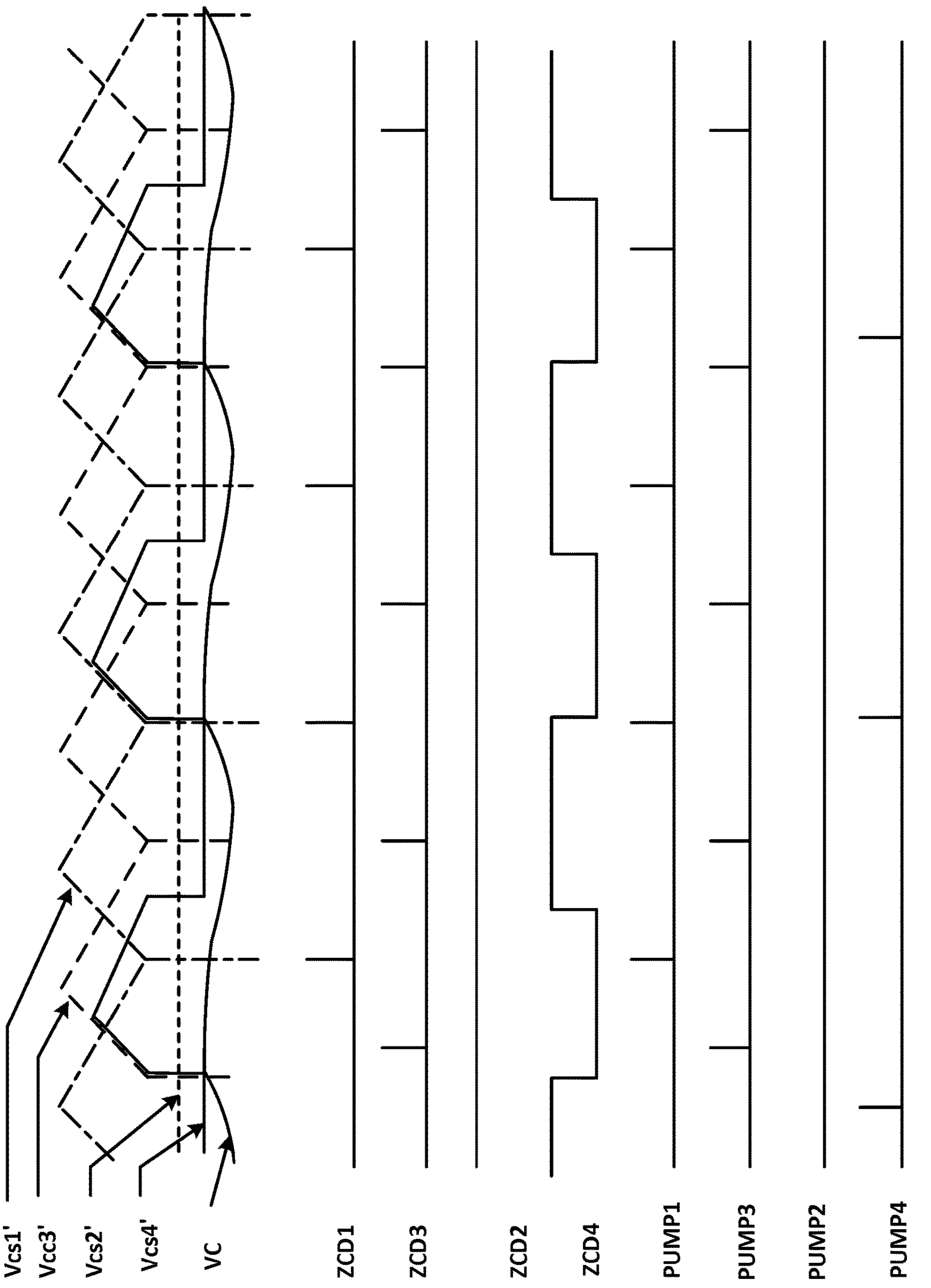
FIG. 6 illustrates a timing diagram of various signals associated with the multi-phase power converter from FIG. 3 in accordance with various embodiments of the present disclosure.

FIG. 6 illustrates a timing diagram of various signals associated with the multi-phase power converter from FIG. 3 in accordance with various embodiments of the present disclosure. Taking a four-phase power converter as an example, FIG. 6 illustrates how each phase transitions from active switching CCM to non-switching DCM in accordance with various embodiments of the present disclosure. The four phases correspond to phase shifts of 0 degrees, 90 degrees, 180 degrees, and 270 degrees relative to the master clock (CLKO). There are nine rows. The first row represents the adjusted current sense voltage Vcs' for each of the four phases (Vcs1', Vcs2', Vcs3', and Vcs4') and the control voltage VC. The second row represents the zero-crossing detection signals for the first phase (ZCD1). The third row represents the zero-crossing detection signals for the third phase (ZCD3). The fourth row represents the zero-crossing detection signals for the second phase (ZCD2). The fifth row represents the zero-crossing detection signals for the fourth phase (ZCD4). The sixth row shows the PUMP signals for the first phase (PUMP1). The seventh row shows the PUMP signals for the third phase (PUMP3). The eighth row shows the PUMP signals for the second phase (PUMP2). The ninth row shows the PUMP signals for the fourth phase (PUMP4).

As shown in FIG. 6, 0 degrees, 90 degrees, 180 degrees, and 270 degrees correspond to Vcs1/ZCD1/PUMP1, Vcs2/ZCD2/PUMP2, Vcs3/ZCD3/PUMP3, and Vcs4/ZCD4/PUMP4, respectively. The VOS offset signals, generated by the Vcs Offset Generator in each phase and applied to Vcs when the ZCD signal goes high, are labeled −VOS4, −VOS1, −VOS3, and −VOS2 for the phases at 0 degrees, 90 degrees, 180 degrees, and 270 degrees, respectively. The amplitudes of the offsets satisfy the relationship VOS4>VOS3>VOS2>VOS1, where VOS1, VOS2, VOS3, and VOS4 are positive values. FIG. 6 illustrates that, at a given moment, the 90-degree phase has already exited, the 270-degree phase is operating in DCM, and the 180-degree and 0-degree phases are still operating in CCM.

As illustrated in FIG. 6, as the load decreases, the phase with the 90-degree shift (associated with the −VOS1 signal) is the first to enter DCM. This occurs because −VOS1 represents the smallest negative offset. This means that the adjusted current sense voltage in the 90-degree phase (Vcs2') will be slightly higher than in other phases with larger negative offsets. This makes Vcs2' more likely to remain above VC as the load decreases. Consequently, as the load continues to drop, the switching frequency of the 90-degree shift phase gradually decreases until it no longer switches. This occurs when VC falls below the threshold set by Vcs0-VOS1, where Vcs0 represents the current sense voltage corresponding to zero inductor current without any additional offset voltage. During this process, the system continuously adjusts VC within the range between Vcs0-VOS1 and Vcs0-VOS2. When VC remains higher than Vcs0-VOS2, the other three phases (0 degrees, 180 degrees, and 270 degrees) continue to operate in CCM, with their inductor currents still crossing zero.

As the load continues to decrease, the system adjusts the VC voltage to fall below Vcs0-VOS2, causing the phase with the 270-degree shift (associated with the −VOS2 signal) to begin entering DCM and similarly reduces its switching frequency until it ceases to switch. During this process, the system will adjust VC within the range between Vcs0-VOS2 and Vcs0-VOS3. When VC falls below Vcs0-VOS3, the phase with the 180-degree shift (associated with the −VOS3 signal) enters DCM and similarly reduces its switching frequency until it ceases to switch. During this process, the system will adjust VC within the range between Vcs0-VOS3 and Vcs0-VOS4, with the 0-degree phase (associated with the −VOS4 signal) still operating in CCM. Finally, as the load continues to decrease, VC drops below Vcs0-VOS4, causing the phase with the 0-degree shift to enter DCM. This phase also decreases its switching frequency until it stops switching entirely. During this process, the system continually adjusts VC within the range between Vcs0-VOS4 and lower clamp of VC, ensuring an orderly transition of each phase into DCM as the load decreases.

Figure 7:
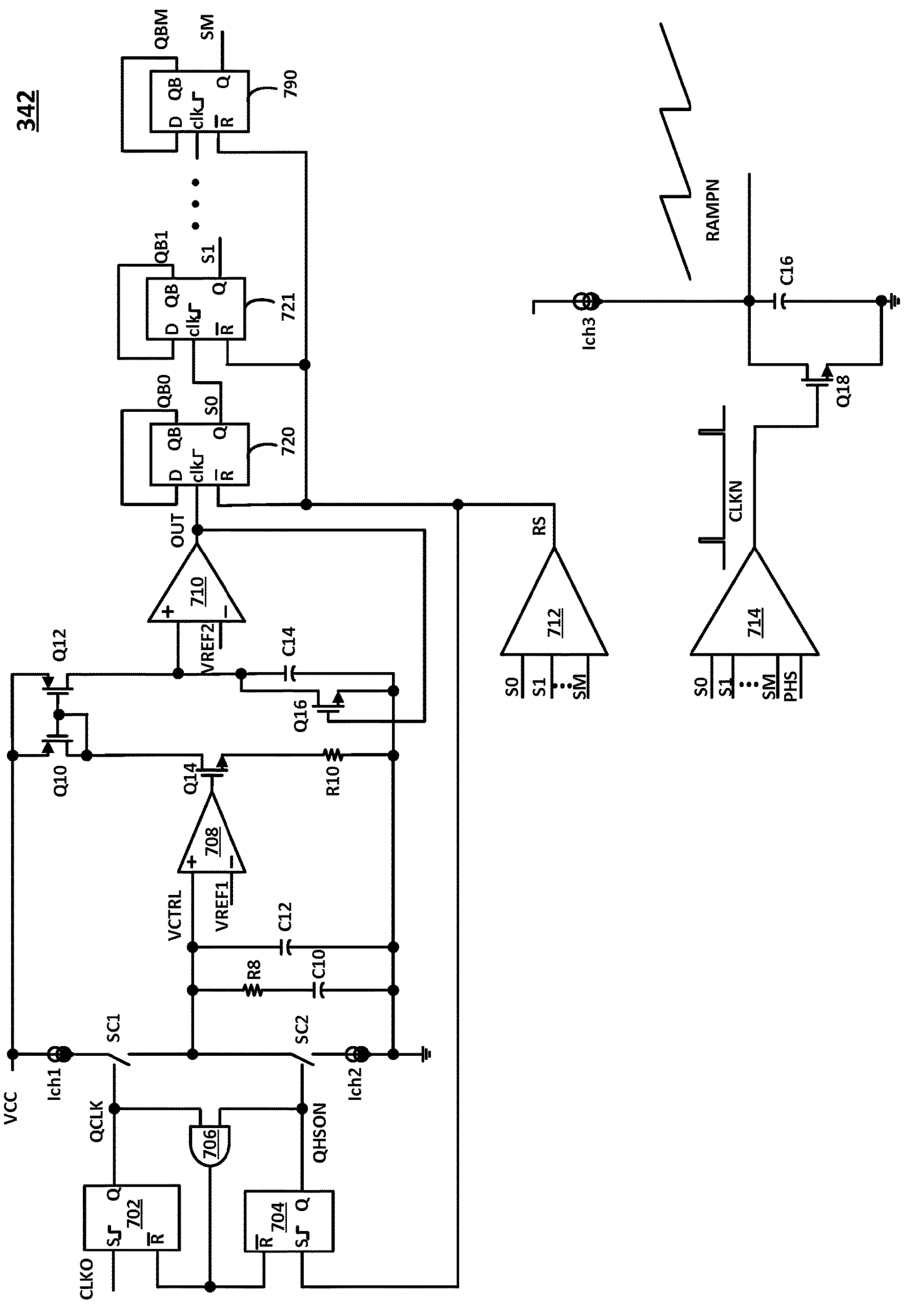
FIG. 7 illustrates a schematic diagram of the Nth ramp generator shown in FIG. 3 in accordance with various embodiments of the present disclosure.

FIG. 7 illustrates a schematic diagram of the Nth ramp generator shown in FIG. 3 in accordance with various embodiments of the present disclosure. The Nth ramp generator uses the input clock signal to generate synchronized, phase-shifted clocks for the Nth phase. The Nth ramp generator 342 comprises a PLL and Oscillator circuit, and a ramp generation circuit. The PLL and Oscillator circuit comprises a first SR flip-flop 702, a second SR flip-flop 704, an AND gate 706, a current mirror comprising a first transistor Q10 and a second transistor Q12, a first current source Ich1, a second current source Ich2, an operational amplifiers 708, a comparator 710, capacitors C10, C12, and C14, resistors R8 and R10, a third transistor Q14 and a fourth transistor Q16, a first switch SC1, a second switch SC2, a plurality of D flip-flops (720, 721, . . . , 790), and a first combinational logic circuit 712.

As illustrated in FIG. 7, an input clock signal is fed into the set input of the first SR flip-flop 702. In a master phase, the input clock signal is the main system clock signal CLK. However, in a slave phase, the input clock signal becomes the CLKO signal generated by the master phase. The CLKO signal is distributed to all slave phases as their clock input to coordinate timing and phase shifts. The reset input of the first SR flip-flop 702 and the reset input of the second SR flip-flop 704 are connected to a common node, and further connected to the output of AND gate 706. The AND gate 706 receives the output signal of the first SR flip-flop 702 (QCLK) at a first input and receives the output of the second SR flip-flop 704 (QHSON) at a second input. The set input of the second SR flip-flop 704 receives an output signal (RS) from the first combinational logic circuit 712.

The first switch SC1 is controlled by the QCLK signal and the second switch SC2 is controlled by the QHSON signal. The current source Ich1, SC1, SC2 and the current source Ich2 are connected in series between VCC and ground. The common node of SC1 and SC2 is denoted as VCTRL. The non-inverting input of the operational amplifier 708 is connected to VCTRL, and the inverting input of the operational amplifier 708 is connected to a reference voltage VREF1. The resistor R8 and the capacitor C10 are connected in series with between VCTRL and ground. The capacitor C12 is connected between VCTRL and ground, and the capacitor C12 is in parallel with the resistor R8 and the capacitor C10. The output of the operational amplifier 708 is connected to the gate of the third transistor Q14.

The third transistor Q14 and the resistor R10 are connected in series between the first transistor Q10 and ground.

The gate of the first transistor Q10 is connected to the gate of the second transistor Q12, and further connected to the drain of the third transistor Q14. The sources of both Q10 and Q12 are connected to VCC. The non-inverting input of the comparator 710 is connected to a common node of the second transistor Q12 and the capacitor C14. The inverting input of the comparator 710 is connected to a reference voltage VREF2. The capacitor C14 is connected between the non-inverting input of the comparator 710 and ground. The output of the comparator 710 (denoted as OUT) is connected to the gate of the fourth transistor Q16, as well as the clock input of the first D flip-flop 720. The source of the fourth transistor Q16 is connected to ground, while the drain of the fourth transistor Q16 is connected to the non-inverting input of the comparator 710.

The D flip-flops 720-790 are connected in a cascaded manner, where the output of one flip-flop serves as the clock input for the next flip-flop in the sequence, and the QB (Q opposite) output of each flip-flop is connected to the D input of the same flip-flop. The output signals (S0 to SM) from the D flip-flops 720-790 are connected to the inputs of the first combinational logic circuit 712, which generates an output signal RS that is connected to the reset inputs of the D flip-flops 720-790, ensuring proper resetting of the flip-flops. Additionally, the RS signal is connected to the set input of the second SR flip-flop 704.

The first combinational logic circuit 712 operates in conjunction with the D flip-flops 720-790 to generate signals that are phase-shifted relative to the input clock signal. Each flip-flop introduces a delay, allowing the circuit to finely control the phase shifts. The first combinational logic circuit 712 receives the output (S0, S1, etc.) of the D flip-flops 720-790 and generates the RS signal. The RS signal determines the reset points of the D flip-flops 720-790, ensuring that phase shifts are consistent, and the phases reset at the correct intervals in the multi-phase power converter.

In operation, if the rising edge of the input clock signal occurs before the rising edge of the RS signal, the QCLK signal goes high and remains high until the rising edge of RS arrives. During this period, when QCLK is high, the switch SC1 closes, increasing the charging current to the capacitor C12 and causing the voltage at VCTRL to rise. The operational amplifier 708 compares VCTRL with the reference voltage VREF1, and modulates the current flow through the third transistor Q14 based on the voltage comparison. As VCTRL increases and surpasses VREF1, the operational amplifier 708 increases the conduction of Q14, which pulls down the gate voltages of transistors Q10 and Q12. The capacitor C14 is charged by the current set by the current mirror formed by Q10 and Q12. As a result, the voltage on C14 increases. If the voltage across C14 reaches the reference voltage VREF2, the comparator 710 outputs a logic-high signal. This increased charging rate of capacitor C12 shortens the output clock period, causing the next rising edge of the output clock signal to occur earlier.

If the rising edge of the RS signal occurs before the rising edge of the input clock signal, the QHSON signal goes high and remains high until the rising edge of the input clock arrives. During this period, when QHSON is high, the switch SC2 closes, causing C12 to discharge. This discharging of C12 results in a drop in the voltage at VCTRL. The operational amplifier 708 then compares VCTRL with VREF1. As VCTRL decreases and falls below VREF1, the operational amplifier 708 decreases the conduction of Q14, which, in turn, reduces the current through the current mirror formed by Q10 and Q12. This reduced current causes C14 to charge more slowly. Since the charging rate of C14 is slower, it takes longer for C14 to reach VREF2. Consequently, the output clock period is extended, delaying the next rising edge of the output clock signal. This process lengthens the output clock period, delaying the next rising edge of the output clock signal.

By modifying the charging and discharging cycle of C12, the circuit shortens or lengthens the output clock period. This feedback mechanism ensures that the output clock signal maintains a fixed phase relationship with the input clock signal. Once a timing deviation is detected, the circuit automatically corrects it, resynchronizing the output clock with the input clock to achieve phase alignment and frequency locking in the multi-phase power converter.

As illustrated in FIG. 7, The ramp generation circuit comprises a current source Ich3, a fifth transistor Q18, a capacitor C16, and a second combinational logic circuit 714. The second combinational logic circuit 714 receives the output signals S0, S1 to SM, and a phase selection signal PHS. The drain of the transistor Q18 is connected to the current source Ich3, and its source connected to ground. The gate of transistor Q18 is controlled by the clock signal CLKN that sets the frequency of the ramp signal RAMPN.

The PHS signal is used to select the desired phase shift for each phase of the multi-phase power converter. In operation, when the second combinational logic circuit 714 receives the PHS signal, it outputs the corresponding phase clock (CLKN) that is used to control the timing of the ramp signal generation in phase N of the power converter. The CLKN signal generated by the second combinational logic circuit 714 is used to control the transistor Q18, which in turn controls the charging and discharging of the capacitor C16 to generate the ramp signal RAMPN. When the clock signal CLKN is low, the transistor Q18 is off. In this state, the capacitor C16 is charged by the current source Ich3. As C16 is charged, the voltage across C16 increases linearly, causing the ramp signal RAMPN to rise. This ramp-up phase continues as long as CLKN remains low. When the clock signal CLKN goes high, the transistor Q18 turns on, allowing the capacitor to discharge rapidly. As the capacitor C16 discharges, the voltage across C16 drops sharply, causing the ramp signal RAMPN to fall sharply. Consequently, the ramp signal RAMPN forms a sawtooth waveform due to the alternating charging and discharging of the capacitor C16.

Figure 8:
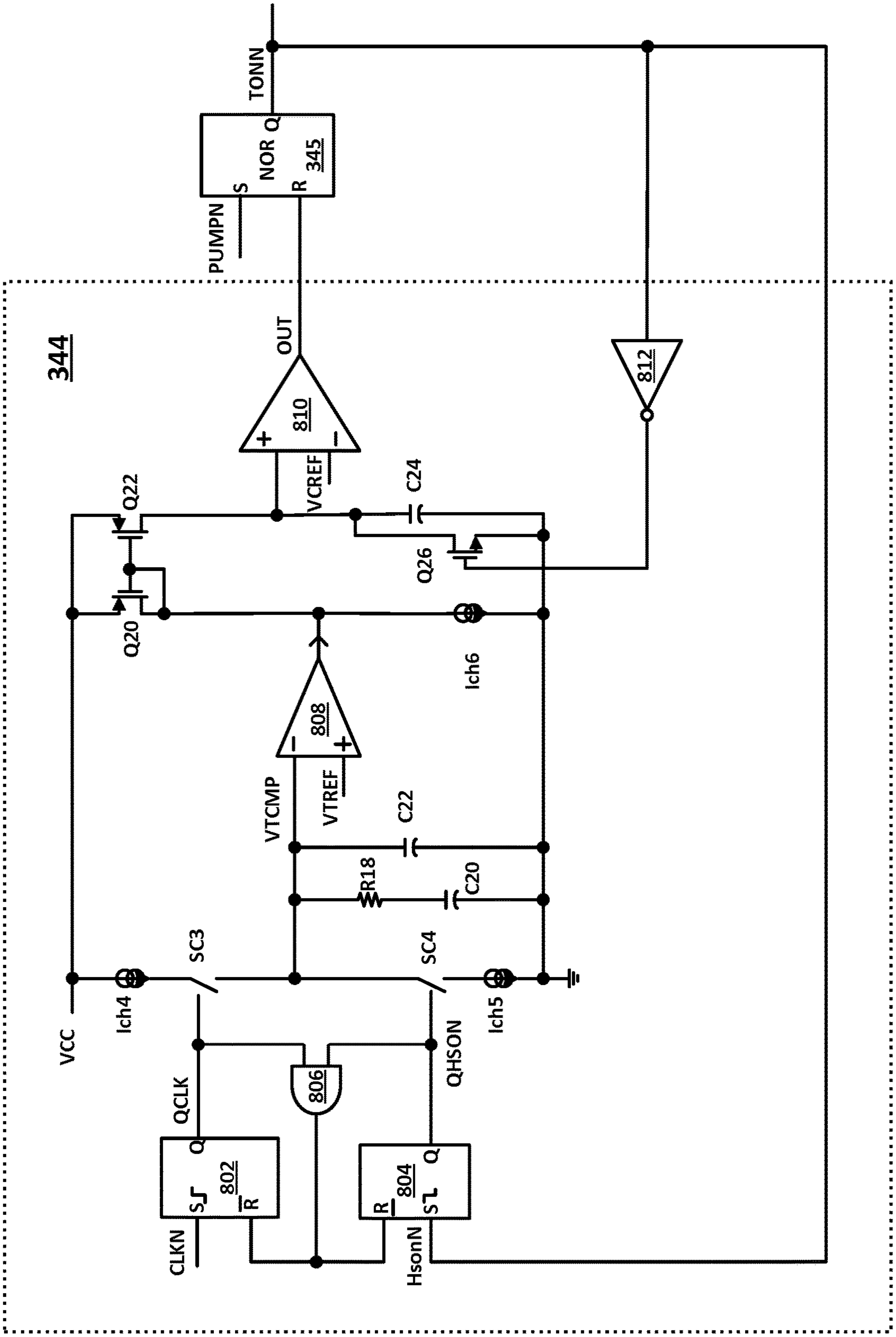
FIG. 8 illustrates a schematic diagram of the Nth on-time generator, as shown in FIG. 3, in accordance with various embodiments of the present disclosure.

FIG. 8 illustrates a schematic diagram of the Nth on-time generator, as shown in FIG. 3, in accordance with various embodiments of the present disclosure. The Nth on-time generator comprises the Nth phase on-timer 344 and the Nth latch 345. CLKN serves as the input clock signal for the Nth on-time generator, while HsonN is the high-side gate drive signal in the Nth phase.

As shown in FIG. 8, the Nth phase on-timer 344 comprises a first latch 802 and a second latch 804, an AND gate 806, a current mirror comprising a first transistor Q20 and a second transistor Q22, a first current source Ich4, a second current source Ich5, a third current source Ich6, an operational amplifier 808, a comparator 810, capacitors C20, C22, and C224, a resistor R18, a third transistor Q26, switches SC3 and SC4, and an inverter 812.

As illustrated in FIG. 8, the CLKN signal is connected to the set input of the first latch 802. The reset input of the first latch 802 and the reset input of the second latch 804 are connected to a common node, and further connected to the output of the AND gate 806. The AND gate 806 receives the output of the first latch 802 (denoted as QCLK) at a first input and receives the output of the second latch 804 (denoted as QHSON) at a second input. The set input of the second latch 804 receives an HsonN signal, which is the output from the Nth latch 345. The switch SC3 is controlled by the QCLK signal. The switch SC4 is controlled by the QHSON signal. The first current source Ich4, the switch SC3, the switch SC4 and the current source Ich5 are connected in series between VCC and ground. The common node of SC3 and SC4 is denoted as VTCMP.

As illustrated in FIG. 8, the inverting input of the operational amplifier 808 is connected to VTCMP. The non-inverting input of the operational amplifier 808 is connected to a reference voltage VTREF. The resistor R18 and the capacitor C20 are connected in series between VTCMP and ground. The capacitor C22 is connected between VTCMP and ground, further in parallel with resistor R18 and capacitor C20. The output of the operational amplifier 808 is connected to the gates of transistors Q20 and Q22. The sources of both Q20 and Q22 are connected to VCC. The non-inverting input of the comparator 810 is connected to a common node of the transistor Q22 and the capacitor C24. The inverting input of comparator 810 is connected to a reference voltage VCREF. In some embodiments, the reference voltage could be the voltage supply VCC. The capacitor C24 is connected between the non-inverting input of the comparator 810 and ground. The output of comparator 810 (denoted as OUT) is connected to the reset input of the Nth latch 345.

The Nth latch 345 generates a TONN signal, which determines the on-time duration of the switch QHN in the Nth phase. The reset input of the Nth latch 345 is configured to receive the output signal of the Nth phase on-timer 344. The set input of the Nth latch 345 is configured to receive the PUMPN signal from the Nth comparator 354. The TONN signal also controls the gate of the third ramp transistor Q26 through the inverter 812. The source of Q26 is connected to ground, while the drain of Q26 is connected to the common node of drain of Q22 and C24.

The Nth phase on-timer 344 synchronizes the HsonN signal of the power converter with the CLKN signal by adjusting the charging current. This adjustment ensures that the operating frequency of the circuit matches the frequency of the CLKN signal. When the system detects that the HsonN signal is out of phase with the CLKN signal, it adjusts the VTCMP voltage, either increasing or decreasing the TONN period to bring the two signals into closer alignment.

As illustrated in FIG. 8, when the rising edge of the CLKN signal occurs before the rising edge of the HsonN signal, the QCLK signal goes high and remains high until the rising edge of HsonN arrives. During this period, while QCLK is high, switch SC3 closes, increasing the charging current to capacitor C22 and causing the voltage at VTCMP to rise. The operational amplifier 808 monitors this rise and adjusts the current to C24 accordingly. As the current to C24 increases, the voltage across C24 rises more quickly. This rapid increase in voltage triggers the comparator 810 sooner, which resets the Nth latch 345. Resetting the Nth latch 345 turns off QHN earlier, thus shortening the TONN period for the Nth phase. This results in the next rising edge of the HsonN signal occurring earlier, aligning the HsonN signal more closely with the CLKN signal.

Conversely, if the rising edge of Hson occurs before the rising edge of CLKN, the QHSON signal goes high and remains high until the rising edge of CLKN arrives. During this period, while QHSON is high, the switch SC4 closes, reducing the voltage at VTCMP and slowing down the charging rate of capacitor C22. The slower charging rate causes the comparator 810 to take longer to output a high signal, keeping the high-side switch QHN on for a longer duration, thereby extending the TONN period and delaying the next rising edge of HsonN. This delay adjusts the timing so that the rising edge of HsonN aligns more closely with the rising edge of CLKN, helping to synchronize the two signals effectively. This continuous adjustment of the TONN period ensures that the switching frequency remains in sync with the CLKN frequency.

Figure 9:
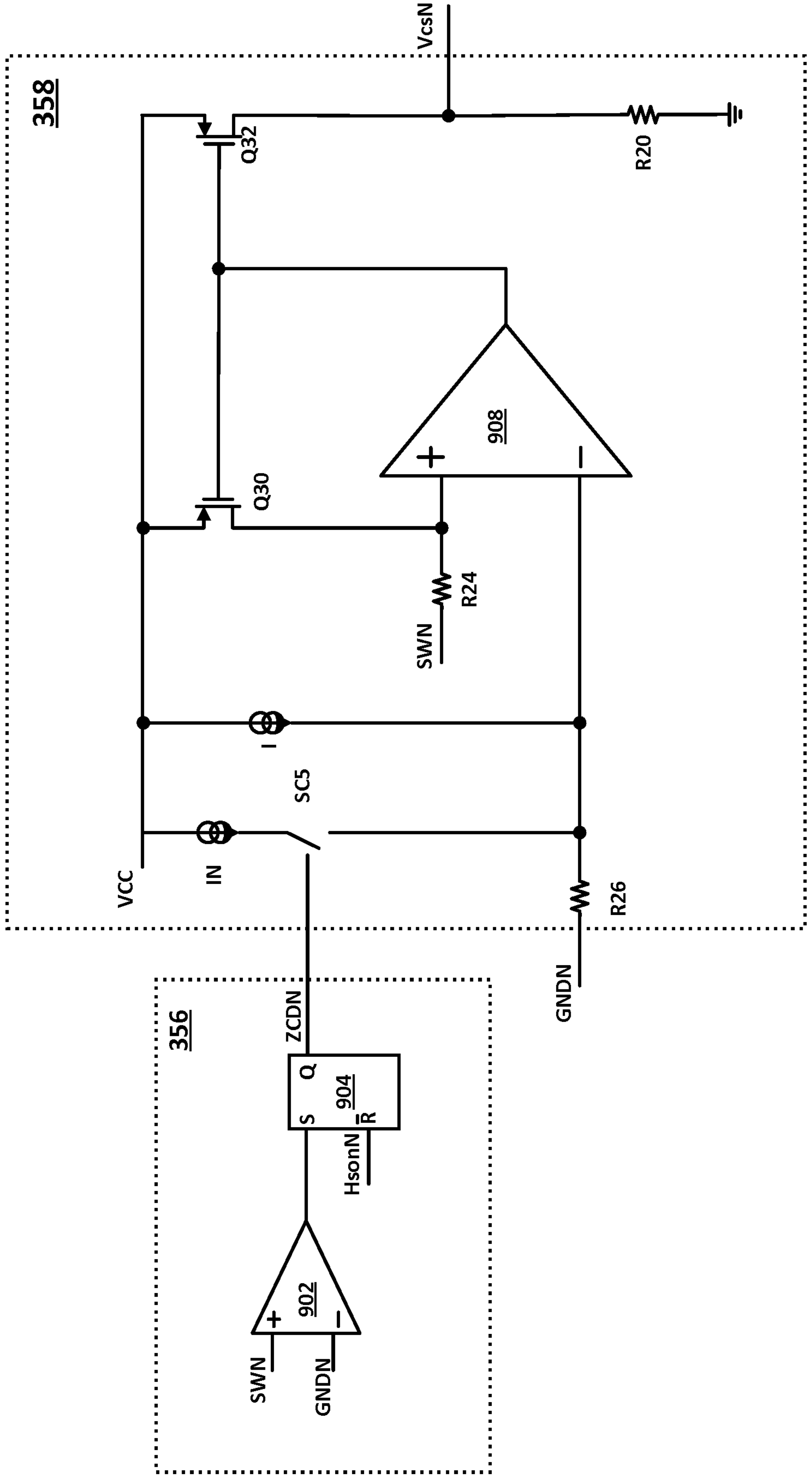
FIG. 9 illustrates a schematic diagram of a zero-crossing detector and a Vcs offset generator in the Nth phase, as shown in FIG. 3, in accordance with various embodiments of the present disclosure.

FIG. 9 illustrates a schematic diagram of a zero-crossing detector and a Vcs offset generator in the Nth phase, as shown in FIG. 3, in accordance with various embodiments of the present disclosure. The Nth zero-crossing detector comprises a comparator 902 and a latch 904. The comparator 902 has its non-inverting input connected to the SWN node and its inverting input connected to a reference voltage, which is typically connected to ground (GNDN). The comparator 902 compares the SWN signal against the reference voltage. When the low-side switch is turned on and the SWN signal crosses zero, the output of the comparator 902 changes state, indicating that a zero-crossing event has occurred. The output signal of the comparator 902 is then fed into the set input of the latch 904, which captures and holds the zero-crossing event until it is processed by subsequent circuitry. The reset input of the latch 904 is connected to the HsonN signal. The output from the latch 904, labeled as ZCDN, indicates when the zero-crossing event occurs. The ZCDN signal is then used to generate the offset voltage in the Nth Vcs offset generator 358.

The Nth Vcs offset generator 358 comprises transistors Q30 and Q32, an amplifier 908, a current source IN, and a current source I. The sources of transistors Q30 and Q32 are connected to VCC. The gates of transistors Q30 and Q32 are connected at a common node, which is further connected to an output of the amplifier 908. The output of the amplifier 908 drives the gates of transistors Q30 and Q32. The non-inverting input of the amplifier 908 receives the SWN signal through a resistor R24. The drain of the transistor Q30 is connected to the non-inverting input of the amplifier 908. The inverting input of the amplifier 908 is connected to GNDN through a resistor R26, establishing a reference voltage fed into the inverting input of the amplifier 908. The current source IN and a switch SC5 are connected in series between the voltage supply VCC and the inverting input of the amplifier 908. The switch SC5 is controlled by the ZCDN signal, which is generated by the Nth zero-crossing detector 356. The current source I is connected between VCC and the inverting input of the amplifier 908. The drain of the transistor Q32 is connected to ground through a resistor R20. The common node of the drain of the transistor Q32 and the resistor R20 is labeled as VcsN, which serves as the output of the Nth Vcs offset generator 358.

In operation, when the inductor current in the Nth phase crosses zero, the Nth zero-crossing detector 356 generates a ZCDN signal. This signal triggers the switch SC5 to close, allowing current from the current source IN to flow into the inverting input of the amplifier 908. The current from IN raises the voltage at the inverting input of the amplifier 908. The amplifier 908 compares the voltage at its non-inverting input (SWN through R24) with the voltage at its inverting input, and adjusts its output to control the gates of transistors Q30 and Q32, which regulate the output voltage VcsN. If the voltage at the inverting input (due to the current from IN) rises above the voltage at the non-inverting input, the amplifier 908 reduces the gate drive voltages applied to transistors Q30 and Q32, causing them to conduct more. As transistors Q30 and Q32 conduct more, the current through their drains to VcsN increases, raising the voltage at VcsN.

Figure 10:
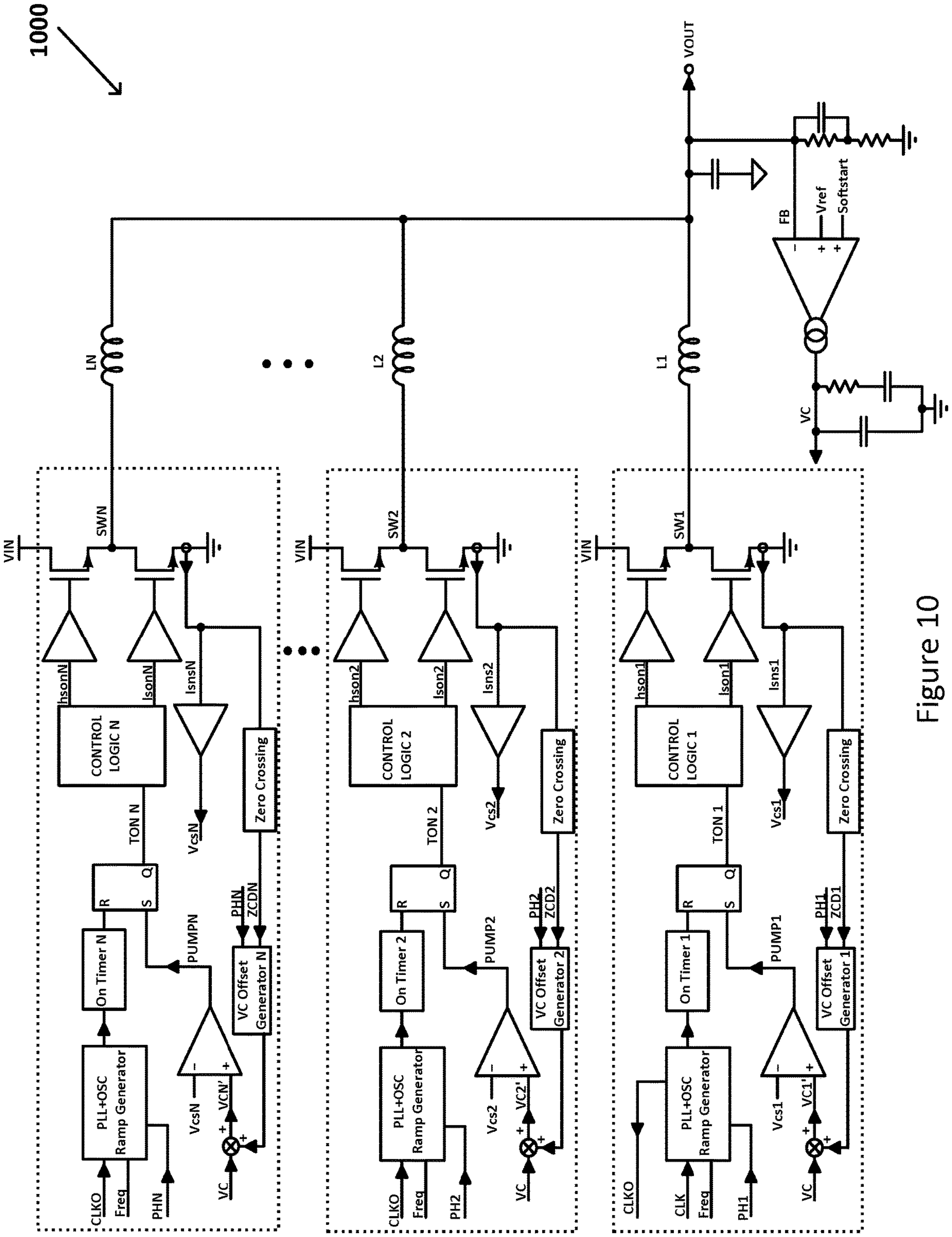
FIG. 10 illustrates a schematic diagram of another multi-phase power converter in accordance with various embodiments of the present disclosure.

FIG. 10 illustrates a schematic diagram of another multi-phase power converter in accordance with various embodiments of the present disclosure. The multi-phase power converter 1000 is similar to the multi-phase power converter 300 shown in FIG. 3 except that the Vcs offset generator in each phase is placed by a VC offset generator. The VC offset voltage generated by the VC offset generator is added to the control voltage (VC) generated by the error amplifier to produce an adjusted control voltage VCN' for the respective phase. The non-inverting input of the comparator in this phase receives the adjusted control voltage VCN', while the inverting input receives the current sense voltage VcsN, which is proportional to the current through the output inductor of that phase.

Figure 11:
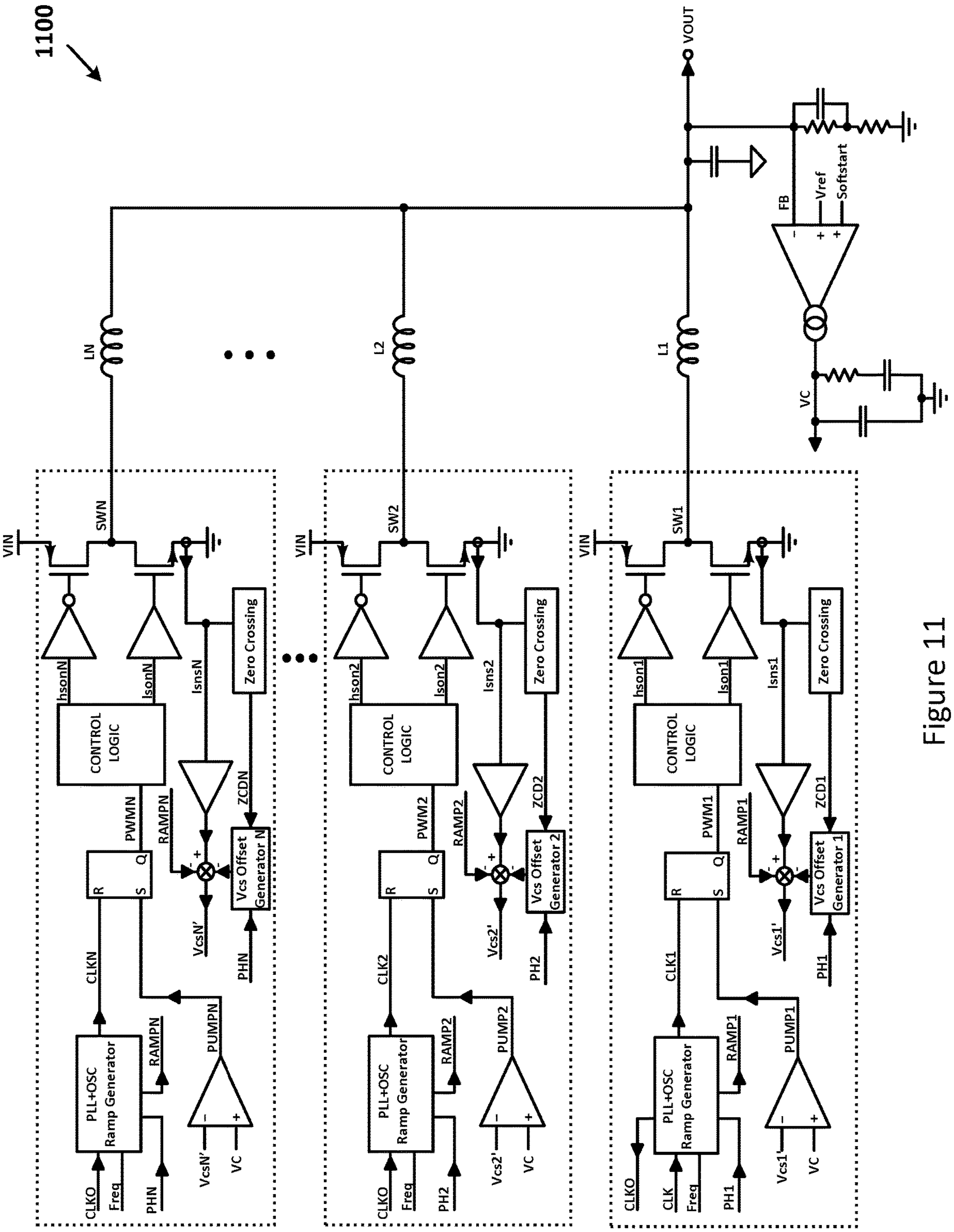
FIG. 11 illustrates a schematic diagram of another multi-phase power converter in accordance with various embodiments of the present disclosure.

FIG. 11 illustrates a schematic diagram of another multi-phase power converter in accordance with various embodiments of the present disclosure. In contrast to FIG. 3, which uses a constant on-time approach for each phase, the multi-phase power converter 1100 in FIG. 11 employs a clock-based approach. In this configuration, the high-side switch QH of each phase is turned off at the rising edge of the clock signal generated by the ramp generator for that phase. As illustrated in FIG. 11, the clock signal generated by the ramp generator is connected to the reset input of the latch in that phase. The ramp signal generated by the ramp generator is also injected into the adjusted current sense voltage (VcsN') to enhance stability and optimize the response of the power converter 1100.

Figure 12:
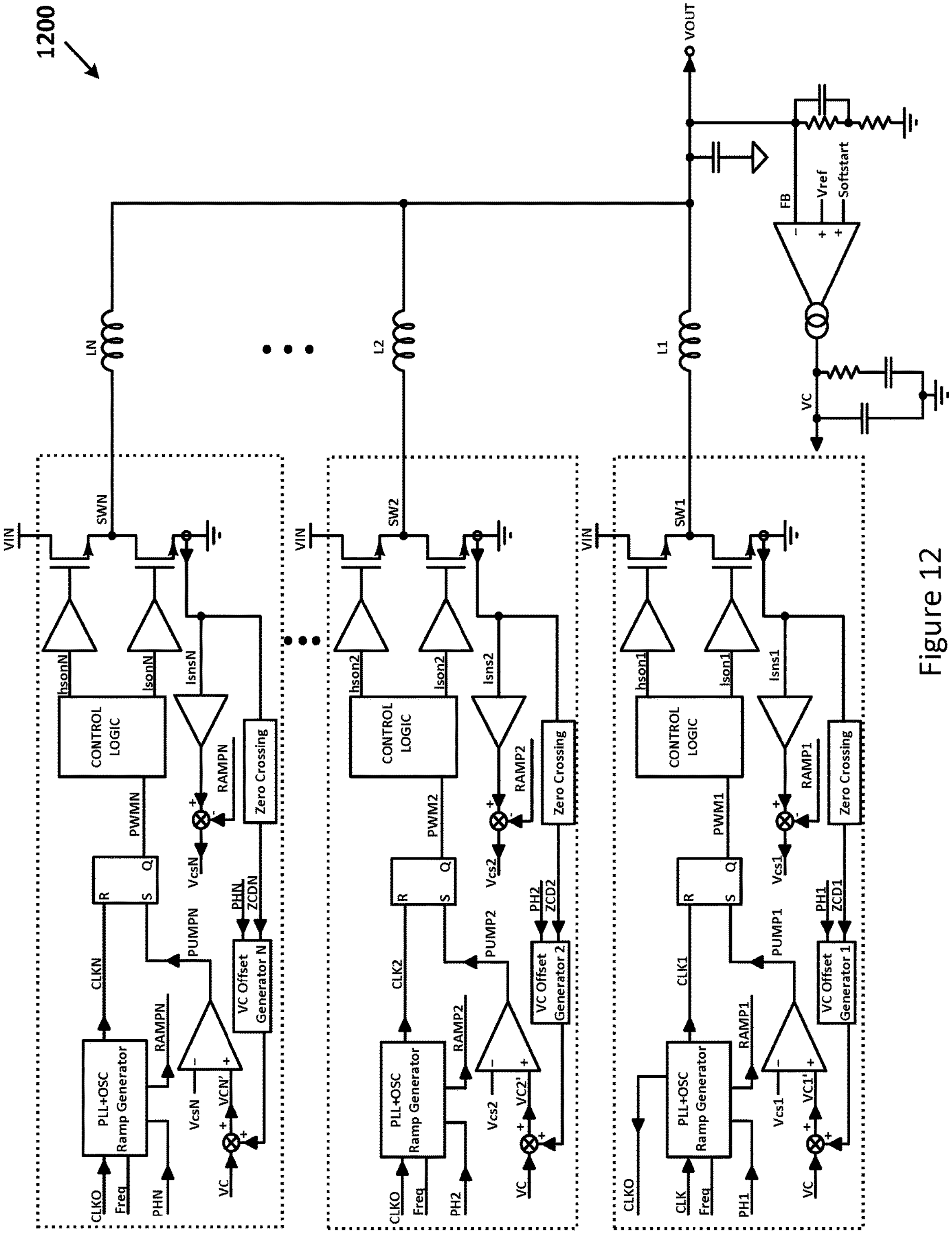
FIG. 12 illustrates a schematic diagram of another multi-phase power converter in accordance with various embodiments of the present disclosure.

FIG. 12 illustrates a schematic diagram of another multi-phase power converter in accordance with various embodiments of the present disclosure. In contrast to FIG. 10, which uses a constant on-time approach for each phase, the multi-phase power converter 1200 in FIG. 12 employs a clock-based approach. In this configuration, the high-side switch QH of each phase is turned off at the rising edge of the clock signal generated by the ramp generator for that phase. As illustrated in FIG. 12, the clock signal generated by the ramp generator is connected to the reset input of the latch in that phase. The ramp signal generated by the ramp generator is also injected into the adjusted current sense voltage (VcsN') to enhance stability and optimize the response of the power converter 1200.

Figure 13:
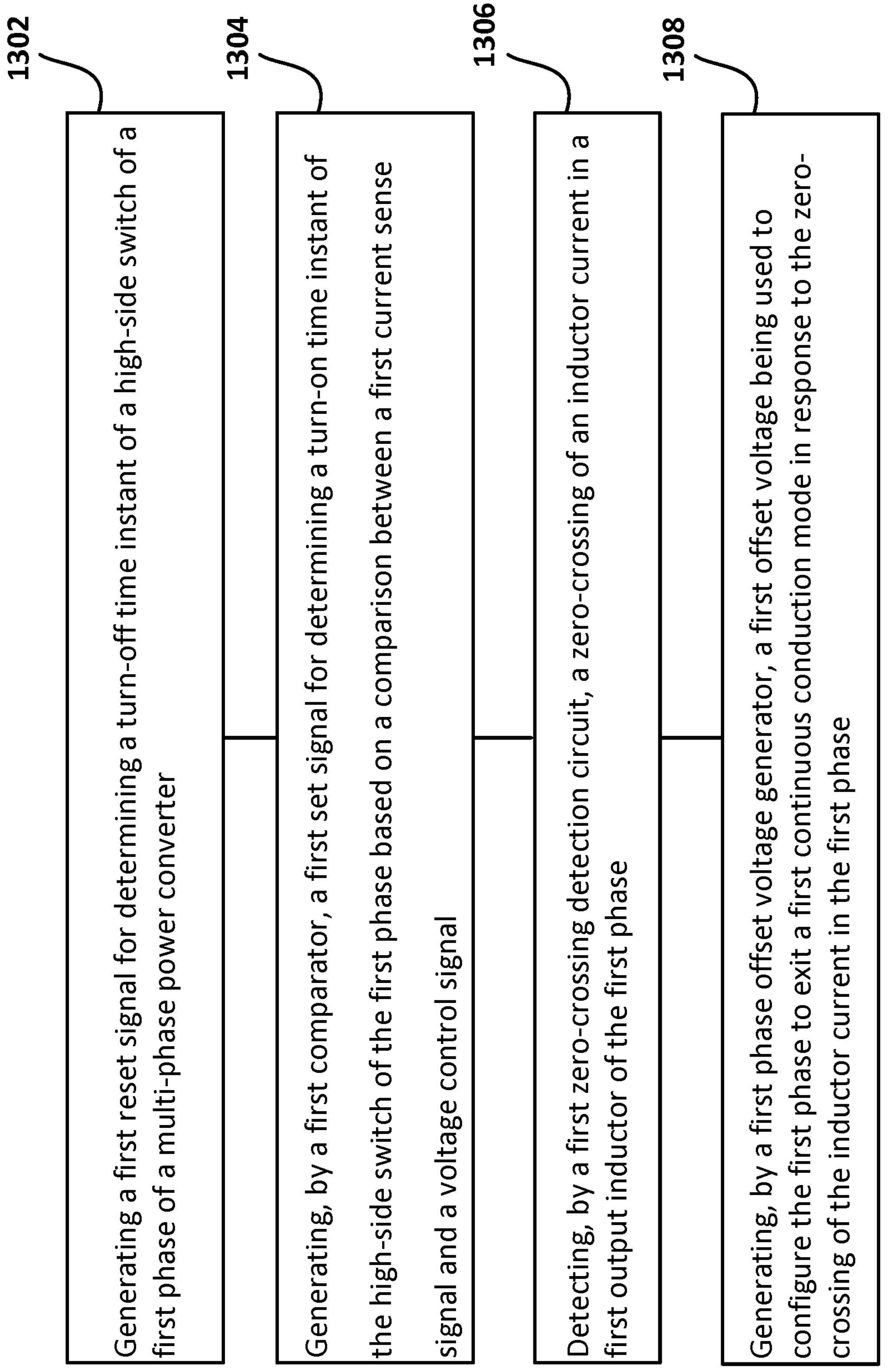
FIG. 13 illustrates a flow chart of a method for controlling a multi-phase power converter in accordance with various embodiments of the present disclosure.

FIG. 13 illustrates a flow chart of a method for controlling a multi-phase power converter in accordance with various embodiments of the present disclosure. This flowchart shown in FIG. 13 is merely an example, which should not unduly limit the scope of the claims. One of ordinary skill in the art would recognize many variations, alternatives, and modifications. For example, various steps illustrated in FIG. 13 may be added, removed, replaced, rearranged and repeated.

A multi-phase power converter (e.g., the multi-phase power converters 300, 1000, 1100, 1200) comprises a plurality of buck converter connected in parallel between an input power source and a load.

At step 1302, a first reset signal is generated for determining a turn-off time instant of a high-side switch of a first phase of a multi-phase power converter.

At step 1304, a first set signal is generated by a first comparator for determining a turn-on time instant of the high-side switch of the first phase based on a comparison between a first current sense signal and a voltage control signal.

At step 1306, a zero-crossing of an inductor current is detected by a first zero-crossing detection circuit in a first output inductor of the first phase.

At step 1308, a first offset voltage is generated by a first phase offset voltage generator. The first offset voltage is used to configure the first phase to exit a first continuous conduction mode in response to the zero-crossing of the inductor current in the first phase.

The method further comprises generating a second reset signal for determining a turn-off time instant of a high-side switch of a second phase of the multi-phase power converter, generating, by a second comparator, a second set signal for determining a turn-on time instant of the high-side switch of the second phase based on a comparison between a second current sense signal and the voltage control signal, detecting, by a second zero-crossing detection circuit, a zero-crossing of an inductor current in a second output inductor of the second phase, and generating, by a second phase offset voltage generator, a second offset voltage being used to configure the second phase to exit a second continuous conduction mode in response to the zero-crossing of the inductor current in the second phase, wherein the first offset voltage is greater than the second offset voltage, and the second phase exits the second continuous conduction mode before the first phase exits the first continuous conduction mode.

The method further comprises generating a first on-time signal using a first on-time generator comprising a first on-timer and a first latch, generating a second on-time signal using a second on-time generator comprising a second on-timer and a second latch, generating, by a first control logic block, a first high-side gate drive signal and a first low-side gate drive signal based on the first on-time signal for driving the high-side switch and a low-side switch of the first phase of the multi-phase power converter, respectively, generating, by a second control logic block, a second high-side gate drive signal and a second low-side gate drive signal based on the second on-time signal for driving the high-side switch and a low-side switch of the second phase of the multi-phase power converter, respectively.

The method further comprises generating the voltage control signal using an error amplifier having an inverting input configured to receive a feedback signal proportional to an output voltage of the multi-phase power converter, and a non-inverting input configured to receive a predetermined reference voltage, producing the first current sense signal by injecting the first offset voltage generated by the first phase offset voltage generator into a first current sense voltage, wherein the first current sense voltage is proportional to the inductor current flowing through the first output inductor, comparing, by the first comparator, the first current sense signal to the voltage control signal to generate the first set signal, producing the second current sense signal by injecting the second offset voltage generated by the second phase offset voltage generator into a second current sense voltage, wherein the second current sense voltage is proportional to the inductor current flowing through the second output inductor, and comparing, by the second comparator, the second current sense signal to the voltage control signal to generate the second set signal.

The method further comprises generating the voltage control signal using an error amplifier having an inverting input configured to receive a feedback signal proportional to an output voltage of the multi-phase power converter, and a non-inverting input configured to receive a predetermined reference voltage, producing a first voltage control signal by injecting the first offset voltage generated by the first phase offset voltage generator into the control voltage signal, generating the first set signal using the first comparator by comparing the first current sense signal to the first voltage control signal, wherein the first current sense voltage is proportional to the inductor current flowing through the first output inductor, producing a second voltage control signal by injecting the second offset voltage generated by the second phase offset voltage generator into the control voltage signal, and generating the second set signal using the second comparator by comparing the second current sense signal to the second voltage control signal, wherein the second current sense signal is proportional to the inductor current flowing through the second output inductor.

The method further comprises generating a first zero-crossing detection signal using the first zero-crossing detection circuit when detecting the zero-crossing of the inductor current in the first phase and generating a second zero-crossing detection signal using the second zero-crossing detection circuit when detecting the zero-crossing of the inductor current in the second phase, wherein each of the first zero-crossing detection circuit the second zero-crossing detection circuit comprises a zero-crossing comparator having a non-inverting input configured to receive a current sense voltage at a common node of the high-side switch and the low-side switch of the respective phase of the multi-phase power converter, and an inverting input configured to receive a reference voltage, and a latch having a set input configured to receive an output signal from the zero-crossing comparator, and a reset input configured to receive a high-side switch control signal of the respective phase, wherein a zero-crossing detection signal of the respective phase is generated at the output of the latch, generating the first offset voltage using the first phase offset voltage generator and generating the second offset voltage using the second phase offset voltage generator, wherein each of the first phase offset voltage generator and the second phase offset voltage generator comprises an amplifier having a non-inverting input configured to receive the current sense voltage through a first resistor, and an inverting input connected to ground through a second resistor, a first current source and a switch connected in series between a voltage source and the inverting input of the amplifier, wherein a gate of the switch is controlled by the zero-crossing detection signal generated in the respective phase, a second current source connected in parallel with the first current source and the switch between the voltage source and the inverting input of the amplifier, and a first transistor and a second transistor, wherein gates of the first transistor and the second transistor are connected at a common node, which is further connected to an output of the amplifier, sources of the first transistor and the second transistor are connected to the voltage source, a drain of the first transistor is connected to the non-inverting input of the amplifier, and a drain of the second transistor is connected to ground through a third resistor, with the common node of the drain of the second transistor and the third resistor serving as an output of the respective phase offset voltage generator.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, which may perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. An apparatus comprising:

a first signal generator configured to produce a first reset signal for determining an on-time duration of a high-side switch of a first phase of a multi-phase power converter;

a first comparator configured to produce a first set signal for determining a turn-on time instant of the high-side switch of the first phase based on a comparison between a first current sense signal and a voltage control signal;

a first zero-crossing detection circuit configured to detect a zero-crossing of a first inductor current in the first phase;

a first phase offset voltage generator configured to produce a first offset voltage used to configure the first phase to exit a first continuous conduction mode in response to the zero-crossing of the first inductor current in the first phase;

a second signal generator configured to produce a second reset signal for determining an on-time duration of a high-side switch of a second phase of the multi-phase power converter;

a second comparator configured to produce a second set signal for determining a turn-on time instant of the high-side switch of the second phase based on a comparison between a second current sense signal and the voltage control signal;

a second zero-crossing detection circuit configured to detect a zero-crossing of a second inductor current in the second phase; and a second phase offset voltage generator configured to produce a second offset voltage used to configure the second phase to exit a second continuous conduction mode in response to the zero-crossing of the second inductor current in the second phase, wherein the first offset voltage is different from the second offset voltage such that the first phase is configured to exit the first continuous conduction mode at a first load level and the second phase is configured to exit the second continuous conduction mode at a second load level different from the first load level.

2. The apparatus of claim 1, the first offset voltage is greater than the second offset voltage; and the second phase exits the second continuous conduction mode before the first phase exits the first continuous conduction mode.

3. The apparatus of claim 2, further comprising a first latch and a second latch, wherein:

a first on-time generator comprises the first signal generator and the first latch, and is configured to generate a first on-time signal fed into a first control logic block, and wherein based on the first on-time signal, the first control logic block is configured to generate a first high-side gate drive signal and a first low-side gate drive signal for driving the high-side switch and a low-side switch of the first phase of the multi-phase power converter, respectively; and a second on-time generator comprises the second signal generator and the second latch, and is configured to generate a second on-time signal fed into a second control logic block, and wherein based on the second on-time signal, the second control logic block is configured to generate a second high-side gate drive signal and a second low-side gate drive signal for driving the high-side switch and a low-side switch of the second phase of the multi-phase power converter, respectively.

4. The apparatus of claim 3, further comprising:

an error amplifier with an inverting input configured to receive a feedback signal proportional to an output voltage of the multi-phase power converter, and a non-inverting input configured to receive a predetermined reference voltage.

5. The apparatus of claim 4, wherein the first zero-crossing detection circuit comprises:

a zero-crossing comparator having a non-inverting input configured to receive a current sense voltage at a common node of the high-side switch and the low-side switch of the first phase, and an inverting input configured to receive a reference voltage; and a latch having a set input configured to receive an output signal from the zero-crossing comparator, and a reset input configured to receive a high-side switch control signal of the first phase, and wherein a zero-crossing detection signal of the first phase is generated at an output of the latch.

6. The apparatus of claim 5, wherein the first phase offset voltage generator comprises:

an amplifier having a non-inverting input configured to receive the current sense voltage through a first resistor, and an inverting input connected to ground through a second resistor;

a first current source and a switch connected in series between a voltage source and the inverting input of the amplifier, and wherein a gate of the switch is controlled by the zero-crossing detection signal generated in the first phase;

a second current source connected in parallel with the first current source and the switch between the voltage source and the inverting input of the amplifier; and a first transistor and a second transistor, and wherein:

gates of the first transistor and the second transistor are connected at a common node, which is further connected to an output of the amplifier;

sources of the first transistor and the second transistor are connected to the voltage source;

a drain of the first transistor is connected to the non-inverting input of the amplifier; and a drain of the second transistor is connected to ground through a third resistor, with a common node of the drain of the second transistor and the third resistor serving as an output of the first phase offset voltage generator.

7. The apparatus of claim 4, wherein:

the first comparator has a non-inverting input configured to receive the voltage control signal generated by the error amplifier, and an inverting input configured to receive the first current sense signal, and wherein the first current sense signal is produced by injecting the first offset voltage into a first current sense voltage, the first current sense voltage being proportional to the inductor current in the first phase; and the second comparator has a non-inverting input configured to receive the voltage control signal generated by the error amplifier, and an inverting input configured to receive the second current sense signal, and wherein the second current sense signal is produced by injecting the second offset voltage into a second current sense voltage, the second current sense voltage being proportional to the inductor current in the second phase.

8. The apparatus of claim 4, wherein:

the first comparator has a non-inverting input configured to receive a first voltage control signal, and an inverting input configured to receive the first current sense signal, and wherein the first voltage control signal is produced by injecting the first offset voltage into the voltage control signal generated by the error amplifier, and the first current sense signal is proportional to the inductor current in the first phase; and the second comparator has a non-inverting input configured to receive a second voltage control signal, and an inverting input configured to receive the second current sense signal, and wherein the second voltage control signal is produced by injecting the second offset voltage into the voltage control signal generated by the error amplifier, and the second current sense signal is proportional to the inductor current in the second phase.

9. The apparatus of claim 1, wherein the first signal generator comprises:

a first phase-locked loop (PLL) circuit configured to generate a plurality of phase-shifted clock signals, and select a clock signal for a corresponding phase; and a second PLL circuit connected in cascade with the first PLL circuit, and wherein:

the second PLL circuit is configured to receive the clock signal and generate a predetermined on-time based on the clock signal.

10. The apparatus of claim 1, wherein:

the first signal generator comprises a PLL circuit configured to generate a clock signal, and wherein the clock signal is used as the first reset signal.

11. A method comprising:

generating a first reset signal for determining a turn-off time instant of a high-side switch of a first phase of a multi-phase power converter;

generating, by a first comparator, a first set signal for determining a turn-on time instant of the high-side switch of the first phase based on a comparison between a first current sense signal and a voltage control signal;

detecting, by a first zero-crossing detection circuit, a zero-crossing of a first inductor current in a first output inductor of the first phase;

generating, by a first phase offset voltage generator, a first offset voltage being used to configure the first phase to exit a first continuous conduction mode in response to the zero-crossing of the first inductor current in the first phase;

generating a second reset signal for determining a turn-off time instant of a high-side switch of a second phase of the multi-phase power converter;

generating, by a second comparator, a second set signal for determining a turn-on time instant of the high-side switch of the second phase based on a comparison between a second current sense signal and the voltage control signal;

detecting, by a second zero-crossing detection circuit, a zero-crossing of a second inductor current in a second output inductor of the second phase; and generating, by a second phase offset voltage generator, a second offset voltage being used to configure the second phase to exit a second continuous conduction mode in response to the zero-crossing of the second inductor current in the second phase, wherein the first offset voltage is different from the second offset voltage such that the first phase is configured to exit the first continuous conduction mode at a first load level and the second phase is configured to exit the second continuous conduction mode at a second load level different from the first load level.

12. The method of claim 11, the first offset voltage is greater than the second offset voltage; and the second phase exits the second continuous conduction mode before the first phase exits the first continuous conduction mode.

13. The method of claim 12, further comprising:

generating a first on-time signal using a first on-time generator comprising a first on-timer and a first latch;

generating a second on-time signal using a second on-time generator comprising a second on-timer and a second latch;

generating, by a first control logic block, a first high-side gate drive signal and a first low-side gate drive signal based on the first on-time signal for driving the high-side switch and a low-side switch of the first phase of the multi-phase power converter, respectively; and generating, by a second control logic block, a second high-side gate drive signal and a second low-side gate drive signal based on the second on-time signal for driving the high-side switch and a low-side switch of the second phase of the multi-phase power converter, respectively.

14. The method of claim 12, further comprising:

generating the voltage control signal using an error amplifier having an inverting input configured to receive a feedback signal proportional to an output voltage of the multi-phase power converter, and a non-inverting input configured to receive a predetermined reference voltage;

producing the first current sense signal by injecting the first offset voltage generated by the first phase offset voltage generator into a first current sense voltage, wherein the first current sense voltage is proportional to the inductor current flowing through the first output inductor;

comparing, by the first comparator, the first current sense signal to the voltage control signal to generate the first set signal;

producing the second current sense signal by injecting the second offset voltage generated by the second phase offset voltage generator into a second current sense voltage, wherein the second current sense voltage is proportional to the inductor current flowing through the second output inductor; and comparing, by the second comparator, the second current sense signal to the voltage control signal to generate the second set signal.

15. The method of claim 12, further comprising:

generating the voltage control signal using an error amplifier having an inverting input configured to receive a feedback signal proportional to an output voltage of the multi-phase power converter, and a non-inverting input configured to receive a predetermined reference voltage;

producing a first voltage control signal by injecting the first offset voltage generated by the first phase offset voltage generator into the voltage control signal;

generating the first set signal using the first comparator by comparing the first current sense signal to the first voltage control signal, wherein the first current sense voltage is proportional to the inductor current flowing through the first output inductor;

producing a second voltage control signal by injecting the second offset voltage generated by the second phase offset voltage generator into the voltage control signal; and generating the second set signal using the second comparator by comparing the second current sense signal to the second voltage control signal, wherein the second current sense signal is proportional to the inductor current flowing through the second output inductor.

16. The method of claim 12, further comprising:

generating a first zero-crossing detection signal using the first zero-crossing detection circuit when detecting the zero-crossing of the inductor current in the first phase; and generating a second zero-crossing detection signal using the second zero-crossing detection circuit when detecting the zero-crossing of the inductor current in the second phase, wherein each of the first zero-crossing detection circuit and the second zero-crossing detection circuit comprises:

a zero-crossing comparator having a non-inverting input configured to receive a current sense voltage at a common node of a high-side switch and a low-side switch of a respective phase of the multi-phase power converter, and an inverting input configured to receive a reference voltage; and a latch having a set input configured to receive an output signal from the zero-crossing comparator, and a reset input configured to receive a high-side switch control signal of the respective phase, wherein a zero-crossing detection signal of the respective phase is generated at an output of the latch;

generating the first offset voltage using the first phase offset voltage generator; and generating the second offset voltage using the second phase offset voltage generator, wherein each of the first phase offset voltage generator and the second phase offset voltage generator comprises:

an amplifier having a non-inverting input configured to receive the current sense voltage through a first resistor, and an inverting input connected to ground through a second resistor;

a first current source and a switch connected in series between a voltage source and the inverting input of the amplifier, wherein a gate of the switch is controlled by the zero-crossing detection signal generated in the respective phase;

a second current source connected in parallel with the first current source and the switch between the voltage source and the inverting input of the amplifier; and a first transistor and a second transistor, wherein:

gates of the first transistor and the second transistor are connected at a common node, which is further connected to an output of the amplifier;

sources of the first transistor and the second transistor are connected to the voltage source;

a drain of the first transistor is connected to the non-inverting input of the amplifier; and a drain of the second transistor is connected to ground through a third resistor, with a common node of the drain of the second transistor and the third resistor serving as an output of the respective phase offset voltage generator.

17. A power converter comprising:

a first step-down converter comprising a first high-side switch, a first low-side switch, and a first inductor;

a second step-down converter comprising a second high-side switch, a second low-side switch, and a second inductor; and a control apparatus comprising:

a first on-timer configured to produce a first reset signal for determining an on-time duration of the first high-side switch;

a first comparator configured to produce a first set signal for determining a turn-on time instant of the first high-side switch based on a comparison between a first current sense signal and a voltage control signal;

a first zero-crossing detection circuit configured to detect a zero-crossing of the current through the first inductor;

a first phase offset voltage generator configured to produce a first offset voltage used to configure the first step-down converter to exit a first continuous conduction mode in response to the zero-crossing of the current through the first inductor;

a second on-timer configured to produce a second reset signal for determining the on-time duration of the second high-side switch;

a second comparator configured to produce a second set signal for determining a turn-on time instant of the second high-side switch based on a comparison between a second current sense signal and a voltage control signal;

a second zero-crossing detection circuit configured to detect a zero-crossing of the current through the second inductor; and a second phase offset voltage generator configured to produce a second offset voltage used to configure the second step-down converter to exit continuous conduction mode in response to the zero-crossing of the current through the second inductor, wherein the first offset voltage is greater than the second offset voltage, the second phase exiting the second continuous conduction mode before the first phase exits the first continuous conduction mode.

18. The power converter of claim 17, wherein:

the first high-side switch and the first low-side switch are connected in series between an input voltage bus and ground;

the first inductor is connected between a common node of the first high-side switch and the first low-side switch, and an output terminal of the power converter;

the second high-side switch and the second low-side switch are connected in series between the input voltage bus and ground; and the second inductor is connected between a common node of the second high-side switch and the second low-side switch, and the output terminal of the power converter.

19. The power converter of claim 17, wherein:

the first zero-crossing detection circuit comprises:

a zero-crossing comparator having a non-inverting input configured to receive a current sense voltage at a common node of the first high-side switch and the first low-side switch, and an inverting input configured to receive a reference voltage; and a latch having a set input configured to receive an output signal from the zero-crossing comparator, and a reset input configured to receive a high-side switch control signal of the first high-side switch, wherein a zero-crossing detection signal of the first step-down converter is generated at an output of the latch; and the first phase offset voltage generator comprises:

an amplifier having a non-inverting input configured to receive the current sense voltage through a first resistor, and an inverting input connected to ground through a second resistor;

a first current source and a switch connected in series between a voltage source and the inverting input of the amplifier, wherein a gate of the switch is controlled by the zero-crossing detection signal;

a second current source connected in parallel with the first current source and the switch between the voltage source and the inverting input of the amplifier; and a first transistor and a second transistor, wherein:

gates of the first transistor and the second transistor are connected at a common node, which is further connected to an output of the amplifier;

sources of the first transistor and the second transistor are connected to the voltage source;

a drain of the first transistor is connected to the non-inverting input of the amplifier; and a drain of the second transistor is connected to ground through a third resistor, with a common node of the drain of the second transistor and the third resistor serving as an output of the first phase offset voltage generator.

20. The power converter of claim 17, further comprising:

an error amplifier with an inverting input configured to receive a feedback signal proportional to an output voltage of the power converter and a non-inverting input configured to receive a predetermined reference voltage, wherein:

the first comparator has a non-inverting input configured to receive the voltage control signal generated by the error amplifier, and an inverting input configured to receive the first current sense signal, and wherein the first current sense signal is produced by injecting the first offset voltage into a first current sense voltage, the first current sense voltage being proportional to the current through the first inductor; and the second comparator has a non-inverting input configured to receive the voltage control signal generated by the error amplifier, and an inverting input configured to receive the second current sense signal, and wherein the second current sense signal is produced by injecting the second offset voltage into a second current sense voltage, the second current sense voltage being proportional to the current through the second inductor.

* * * * *